(12) United States Patent
Kim et al.

(10) Patent No.: US 12,477,826 B2
(45) Date of Patent: Nov. 18, 2025

(54) DISPLAY DEVICE AND METHOD OF FABRICATING THE SAME

(71) Applicant: Samsung Display Co., LTD., Yongin-si (KR)

(72) Inventors: Hyung Jun Kim, Seoul (KR); So Young Koo, Hwaseong-si (KR); Eok Su Kim, Seoul (KR); Yun Yong Nam, Hwaseong-si (KR); Jun Hyung Lim, Seoul (KR); Kyung Jin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 621 days.

(21) Appl. No.: 17/860,593

(22) Filed: Jul. 8, 2022

(65) Prior Publication Data

US 2023/0127261 A1    Apr. 27, 2023

(30) Foreign Application Priority Data

Oct. 22, 2021  (KR) ........................ 10-2021-0141694

(51) Int. Cl.
*H10D 86/60*    (2025.01)
*H01L 25/16*    (2023.01)
(Continued)

(52) U.S. Cl.
CPC ........... *H10D 86/60* (2025.01); *H01L 25/167* (2013.01); *H10D 86/0231* (2025.01);
(Continued)

(58) Field of Classification Search
None
See application file for complete search history.

(56) References Cited

U.S. PATENT DOCUMENTS

| 11,362,250 B2 | 6/2022 | Kim et al. |
| 11,502,110 B2 | 11/2022 | Seo et al. |

(Continued)

FOREIGN PATENT DOCUMENTS

| KR | 10-2016-0029487 | 3/2016 |
| KR | 10-2021-0090780 | 7/2021 |

(Continued)

OTHER PUBLICATIONS

Korean Office Action for KR Application No. 10-2021-0141694, dated Jul. 8, 2025, 6 pages.

*Primary Examiner* — Bo B Jang
(74) *Attorney, Agent, or Firm* — Womble Bond Dickinson (US) LLP

(57) ABSTRACT

A display device includes a first conductive layer including a first voltage line and a second voltage line, a buffer layer, a semiconductor layer including a first active layer and a second active layer, a first gate insulating layer, a second conductive layer including a first gate electrode overlapping the first active layer and a second gate electrode overlapping the second active layer, a passivation layer, a via layer, a bank pattern layer including a first bank pattern and a second bank pattern partially spaced apart from each other, a third conductive layer including a first electrode and a second electrode spaced apart from each other, and light emitting elements. The passivation layer includes silicon nitride ($SiN_x$), and a ratio of a number of silicon-hydrogen bonds (Si—H) to a number of nitrogen-hydrogen bonds (N—H) in the silicon nitride ($SiN_x$) is in a range of about 1:0.6 to about 1:1.5.

13 Claims, 23 Drawing Sheets

(51) Int. Cl.
*H10D 86/01* (2025.01)
*H10D 86/40* (2025.01)
*H10H 20/857* (2025.01)
*H01L 23/00* (2006.01)

(52) U.S. Cl.
CPC .......... *H10D 86/451* (2025.01); *H01L 24/24* (2013.01); *H01L 24/25* (2013.01); *H01L 2224/24051* (2013.01); *H01L 2224/24147* (2013.01); *H01L 2224/25175* (2013.01); *H01L 2924/12041* (2013.01); *H10H 20/857* (2025.01)

(56) References Cited

U.S. PATENT DOCUMENTS

| | | | |
|---|---|---|---|
| 11,870,025 B2 | 1/2024 | Kim et al. | |
| 12,027,527 B2 | 7/2024 | Seo et al. | |
| 2021/0217739 A1* | 7/2021 | Lee | H10H 20/821 |
| 2021/0296367 A1* | 9/2021 | Seo | H10D 86/0223 |
| 2021/0313498 A1* | 10/2021 | Kim | H01L 25/0753 |
| 2024/0312998 A1 | 9/2024 | Seo et al. | |

FOREIGN PATENT DOCUMENTS

| | | |
|---|---|---|
| KR | 10-2021-0117389 A | 9/2021 |
| KR | 10-2021-0124564 A | 10/2021 |
| KR | 10-2021-0126187 A | 10/2021 |

\* cited by examiner

DISPLAY DEVICE AND METHOD OF FABRICATING THE SAME

CROSS-REFERENCE TO RELATED APPLICATION(S)

This application claims priority to and benefits of Korean Patent Application No. 10-2021-0141694 under 35 U.S.C. § 119, filed on Oct. 22, 2021, in the Korean Intellectual Property Office (KIPO), the entire contents of which are incorporated herein by reference.

BACKGROUND

1. Technical Field

The disclosure relates to a display device and a method of fabricating the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device capable of preventing a change in characteristics of a transistor element and a method of fabricating the display device.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device includes a first conductive layer disposed on a substrate and comprising a first voltage line and a second voltage line, a buffer layer disposed on the first conductive layer, a semiconductor layer comprising a first active layer and a second active layer disposed on the buffer layer, a first gate insulating layer disposed on the semiconductor layer, a second conductive layer disposed on the first gate insulating layer and comprising a first gate electrode overlapping the first active layer in a plan view, and a second gate electrode overlapping the second active layer in a plan view, a passivation layer disposed on the second conductive layer and the semiconductor layer, a via layer disposed on the passivation layer, a bank pattern layer disposed on the via layer and comprising a first bank pattern and a second bank pattern partially spaced apart from each other, a third conductive layer disposed on the bank pattern layer and comprising a first electrode and a second electrode spaced apart from each other, and light emitting elements disposed on the first electrode and the second electrode of the third conductive layer, wherein the passivation layer comprises silicon nitride (SiNx), and a ratio of a number of silicon-hydrogen bonds (Si—H) to a number of nitrogen-hydrogen bonds (N—H) in the silicon nitride (SiNx) is in a range of about 1:0.6 to about 1:1.5.

The display device may further comprise a first electrode contact hole that penetrates the bank pattern layer, the via layer, and the passivation layer, and a second electrode contact hole that penetrates the bank pattern layer, the via layer, the passivation layer, and the buffer layer.

A diameter of each of the first electrode contact hole and the second electrode contact hole measured on an upper surface of the bank pattern layer may be in a range of about 4 to about 10 µm.

The first electrode contact hole may expose a part of the first active layer, the second electrode contact hole exposes a part of the second voltage line, the first electrode may directly contact the first active layer through the first electrode contact hole, and the second electrode may directly contact the second voltage line through the second electrode contact hole.

The passivation layer may directly contact the first active layer and the second active layer.

The first conductive layer may further comprise a bottom metal layer overlapping the first active layer in a plan view, and a data line electrically connected to the second active layer, and the third conductive layer may further comprise a plurality of electrode patterns electrically connected to any one of the first voltage line, the data line, and the first gate electrode.

The first electrode may directly contact the bottom metal layer through a third electrode contact hole penetrating the bank pattern layer, the via layer, the passivation layer, and the buffer layer.

The electrode patterns may comprise a first electrode pattern, and the first electrode pattern may directly contact the first gate electrode through a first contact hole penetrating the bank pattern layer, the via layer and the passivation layer and directly contact the second active layer through a second contact hole penetrating the bank pattern layer, the via layer, and the passivation layer.

The electrode patterns may comprise a second electrode pattern, and the second electrode pattern may directly contact the second active layer through a third conductive hole penetrating the bank pattern layer, the via layer and the passivation layer and directly contact the data line through a fourth contact hole penetrating the bank pattern layer, the via layer, the passivation layer, and the buffer layer.

The electrode patterns may comprise a third electrode pattern, and the third electrode pattern may directly contact the first active layer through a fifth contact hole penetrating the bank pattern layer, the via layer and the passivation layer and directly contact the first voltage line through a sixth contact hole penetrating the bank pattern layer, the via layer, the passivation layer, and the buffer layer.

The light emitting elements may be disposed between the first bank pattern and the second bank pattern, the first electrode may be disposed on the first bank pattern, and the second electrode may be disposed on the second bank pattern.

The display device may further comprise a first insulating layer that is disposed on the third conductive layer, wherein the light emitting elements may be disposed directly on the first insulating layer.

The display device may comprise a second insulating layer disposed on the light emitting elements, a third insulating layer disposed on the second insulating layer, a first connection electrode disposed on the first electrode and electrically contacting first ends of the light emitting elements, and a second connection electrode disposed on the second electrode and electrically contacting second ends of the light emitting elements.

The display device may further comprise a bank layer that is disposed on the first insulating layer and surrounds an area where the light emitting elements are disposed.

According to an embodiment of the disclosure, a method of fabricating a display device, the method comprising: preparing a substrate and forming a first conductive layer disposed on the substrate, a buffer layer disposed on the first conductive layer, active layers disposed on the buffer layer, and a second conductive layer disposed on the active layers, forming a passivation layer disposed on the second conductive layer and the active layers, forming a via layer disposed on the passivation layer and a bank pattern layer disposed on the via layer and forming contact holes penetrating the bank pattern layer, the via layer and the passivation layer, and forming a third conductive layer that comprises a first electrode disposed on the bank pattern layer and a second electrode spaced apart from the first electrode and placing light emitting elements on the first electrode and the second electrode, wherein the passivation layer comprises silicon nitride ($SiN_x$), and a ratio of a number of silicon-hydrogen bonds (Si—H) to a number of nitrogen-hydrogen bonds (N—H) in the silicon nitride ($SiN_x$) is in a range of about 1:0.6 to about 1:1.5.

The forming of the passivation layer may comprise forming a passivation layer material layer on the second conductive layer and the active layers and causing part of hydrogen contained in the passivation layer material layer to be discharged by heat-treating the passivation layer material layer.

The forming of the passivation layer material layer may be performed by a process of depositing a silicon nitride layer by injecting $SiH_4$, $NH_3$, and $H_2$ onto the second conductive layer and the active layers, wherein a ratio of $SiH_4$ to $NH_3$ injected in the deposition process may be in a range of about 1:4 to about 1:1.5, and a ratio of $SiH_4$ to $H_2$ injected is in a range of about 1:8 to about 1:10.

The heat-treating of the passivation layer material layer may be performed at a temperature of about 250° C. or higher.

The contact holes may be formed to partially expose the active layers, and the passivation layer directly contacts the active layers.

The first conductive layer may comprise a bottom metal layer overlapping a first active layer in a plan view, a first voltage line electrically connected to the first active layer and a second voltage line electrically connected to a second active layer, the first electrode may directly contact the first active layer through a first electrode contact hole penetrating the bank pattern layer, the via layer and the passivation layer, and the second electrode may directly contact the second voltage line through a second electrode contact hole penetrating the bank pattern layer, the via layer, the passivation layer and the buffer layer.

The first electrode directly may contact the bottom metal layer through a third electrode contact hole penetrating the bank pattern layer, the via layer, the passivation layer, and the buffer layer.

The third conductive layer may further comprise a first electrode pattern that directly contacts the second conductive layer and the second active layer through contact holes penetrating the bank pattern layer, the via layer, and the passivation layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that the terms "contact," "connected to," and "coupled to" may include a physical and/or electrical contact, connection, or coupling.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1:
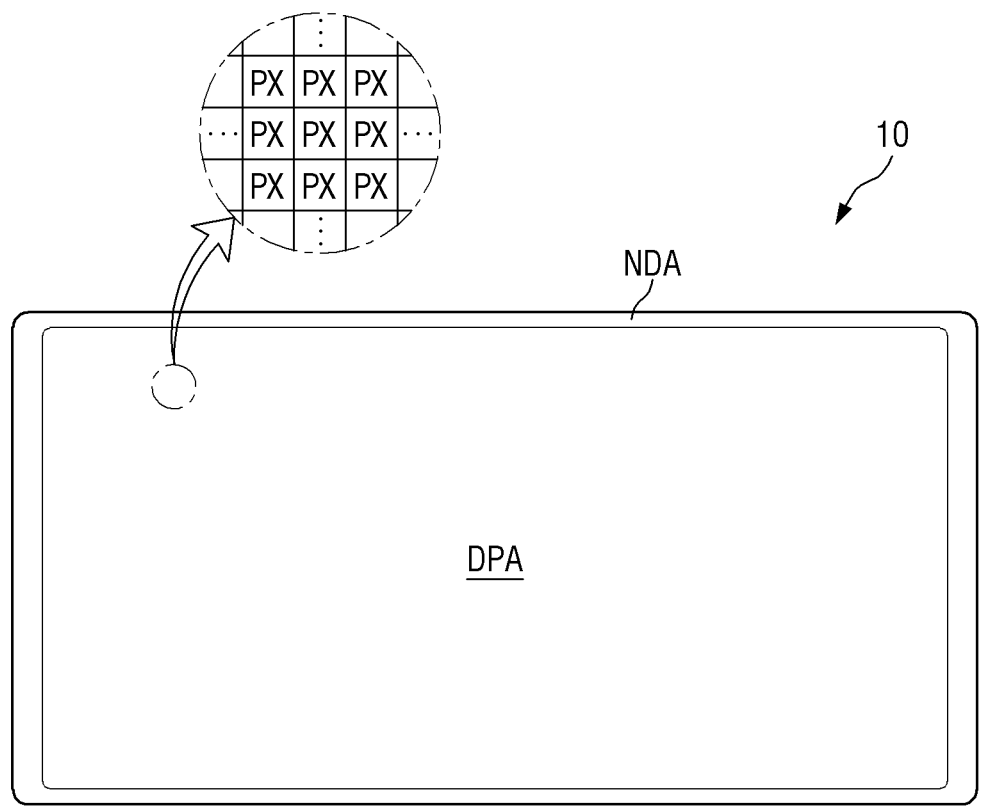
FIG. 1 is a schematic plan view of a display device according to an embodiment.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, notebook computers, monitors, billboards, Internet of things (IoT) devices, mobile phones, smartphones, tablet personal computers (PCs), electronic watches, smartwatches, watch phones, head-mounted displays, mobile communication terminals, electronic notebooks, electronic books, portable multimedia players (PMPs), navigation devices, game machines, digital cameras, and camcorders, all of which provide a display screen.

The display device 10 includes a display panel that provides a display image. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied as long as the same technical spirit is applicable thereto.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. FIG. 1 illustrates the display device 10 shaped like a rectangle that is long in a second direction DR2.

The display device 10 may include the display area DPA and a non-display area NDA. The display area DPA is an area where an image can be displayed, and the non-display area NDA is an area where no image is displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic shape having each side inclined with respect to a direction. The pixels PX may be arranged in a stripe type or an island type. In addition, each of the pixels PX may display a specific color by including one or more light emitting elements which emit light of a specific wavelength band.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
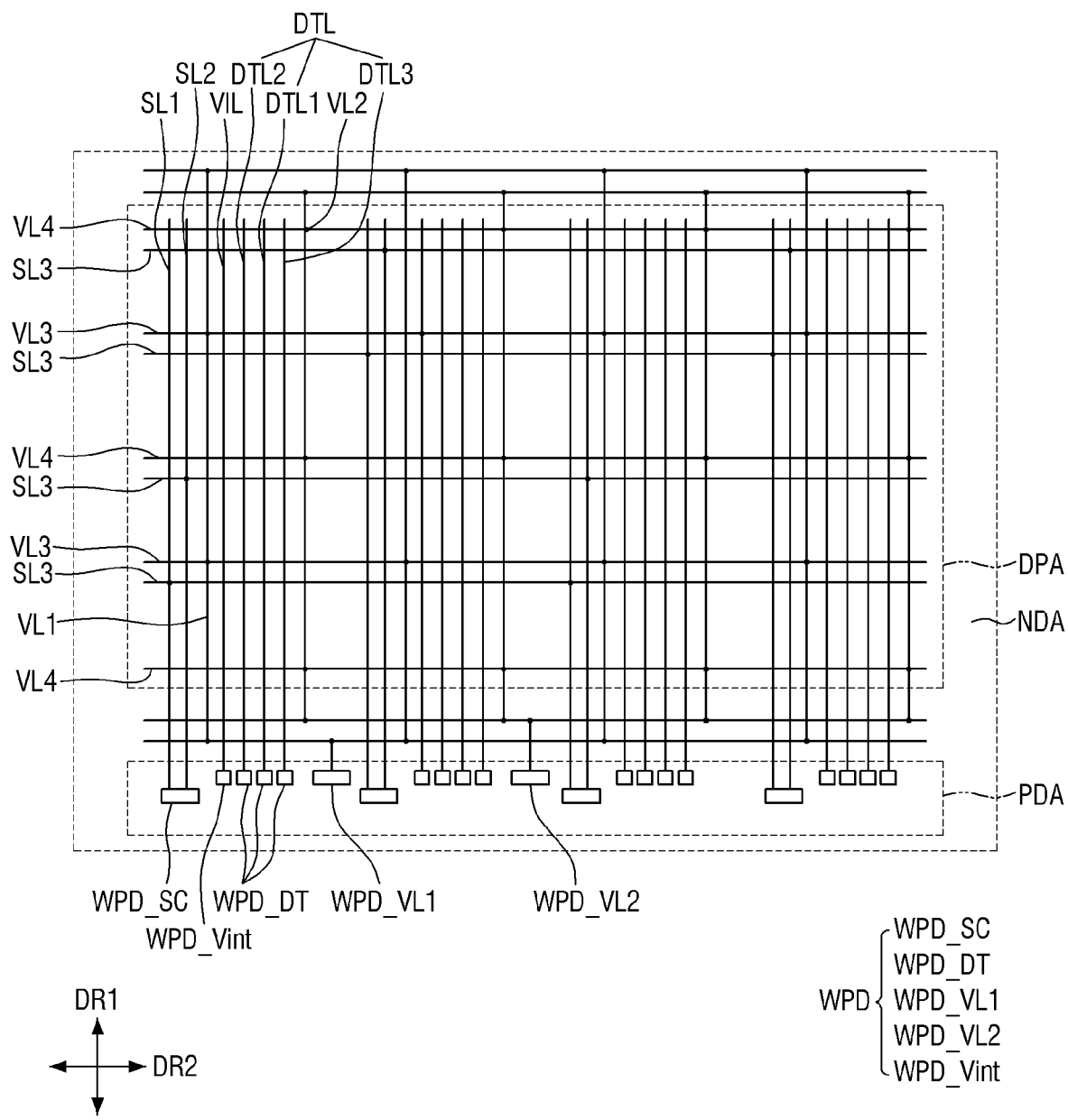
FIG. 2 is schematic a plan view illustrating the arrangement of wirings included in the display device according to the embodiment.

FIG. 2 is a schematic plan view illustrating the arrangement of wirings included in the display device 10 according to an embodiment.

Referring to FIG. 2, the display device 10 may include wirings. The display device 10 may include scan lines SL (SL1 to SL3), data lines DTL (DTL1 to DTL3), initialization voltage lines VIL, and voltage lines VL (VL1 to VL4). Although not illustrated in the drawing, other wirings may be further disposed in the display device 10.

First scan lines SL1 and second scan lines SL2 may extend in a first direction DR1. A first scan line SL1 and a second scan line SL2 in each pair may be disposed adjacent to each other and may be spaced apart from other first scan lines SL1 and other second scan lines SL2 in the second direction DR2. The first scan line SL1 and the second scan line SL2 in each pair may be connected to a scan wiring pad WPD_SC connected to a scan driver (not illustrated). The first scan lines SL1 and the second scan lines SL2 may extend from a pad area PDA, disposed in the non-display area NDA, to the display area DPA.

Third scan lines SL3 may extend in the second direction DR2, and each of the third scan lines SL3 may be spaced apart from other third scan lines SL3 in the first direction DR1. A third scan line SL3 may be connected to one or more first scan lines SL1 or one or more second scan lines SL2. In an embodiment, the first scan lines SL1 and the second scan lines SL2 may be formed as (or formed of) a conductive layer disposed on a different layer from the third scan lines SL3. The scan lines SL may have a mesh structure in the entire display area DPA, but the disclosure is not limited thereto.

In the specification, the term "connect" may mean that any one member and another member are connected to each other not only through physical contact but also through the other member. In addition, it can be understood that any one part and another part are connected to each other as an integrated member. Further, the connection between any one member and another member can be interpreted as including electrical connection through another member in addition to connection using direct contact.

The data lines DTL may extend in the first direction DR1. The data lines DTL include first data lines DTL1, second data lines DTL2, and third data lines DTL3. The first to third data lines DTL1 to DTL3 form a group and are disposed adjacent to each other. Each of the data lines DTL1 to DTL3 may extend from the pad area PDA, disposed in the non-display area NDA, to the display area DPA. However, the disclosure is not limited thereto, and the data lines DTL may be disposed at equal intervals between a first voltage line VL1 and a second voltage line VL2 in each pair which will be described later.

The initialization voltage lines VIL may extend in the first direction DR1. Each of the initialization voltage lines VIL may be disposed between the data lines DTL and the first and second scan lines SL1 and SL2. The initialization voltage lines VIL may extend from the pad area PDA, disposed in the non-display area NDA, to the display area DPA.

First voltage lines VL1 and second voltage lines VL2 extend in the first direction DR1, and third voltage lines VL3 and fourth voltage lines VL4 extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may extend in the first direction DR1 to cross the display area DPA. Among the third voltage lines VL3 and the fourth voltage lines VL4, some lines may be disposed in the display area DPA, and other lines may be disposed in the non-display area NDA located on sides (e.g., both or opposite sides) of the display area DPA in the first direction DR1. The first voltage lines VL1 and the second voltage lines VL2 may be formed as a conductive layer disposed on a different layer from the third voltage lines VL3 and the fourth voltage lines VL4. Each of the first voltage lines VL1 may be connected to at least one third voltage line VL3, and each of the second voltage lines VL2 may be connected to at least one fourth voltage line VL4. The voltage lines VL may have a mesh structure in the entire display area DPA. However, the disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In an embodiment, each wiring pad WPD may be disposed in the pad area PDA located on a lower side of the display area DPA which is a second side in the first direction DR1. Each pair of the first and second scan lines SL1 and SL2 are connected to the scan wiring pad WPD_SC disposed in the pad area PDA, and the data lines DTL are connected to different data wiring pads WPD_DT, respectively. Each of the initialization voltage lines VIL is connected to an initialization wiring pad WPD_Vint, the first voltage lines VL1 are connected to a first voltage wiring pad WPD_VL1, and the second voltage lines VL2 are connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the disclosure is not limited thereto. Some of the wiring pads WPD may also be disposed in an area located on an upper side or any of left and right sides of the display area DPA.

Each pixel PX or subpixel SPXn (where n is an integer of 1 to 3) of the display device 10 includes a pixel driving circuit. The above-described wirings may transmit a driving signal to each pixel driving circuit while passing through or by each pixel PX. The pixel driving circuit may include a transistor and a capacitor. The numbers of transistors and capacitors in each pixel driving circuit can be variously changed. According to an embodiment, each subpixel SPXn of the display device 10 may have a 3T1C structure in which the pixel driving circuit includes three transistors and a capacitor. Although the pixel driving circuit will be described below using the 3T1C structure as an example, the disclosure is not limited thereto, and other various modified pixel structures such as a 2T1C structure, a 7T1C structure, and a 6T1C structure are also applicable.

Figure 3:
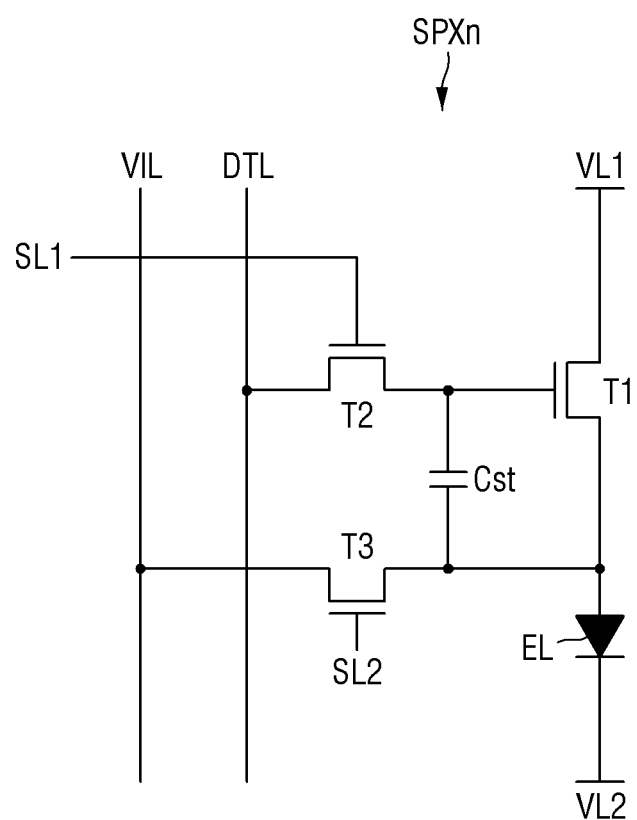
FIG. 3 is a schematic diagram of an equivalent circuit of a subpixel of the display device according to the embodiment.

FIG. 3 is a schematic diagram of an equivalent circuit of a subpixel SPXn according to an embodiment.

Referring to FIG. 3, each subpixel SPXn of the display device 10 according to the embodiment includes three transistors T1 to T3 and a storage capacitor Cst in addition to a light emitting diode EL.

The light emitting diode EL emits light according to a current supplied through a first transistor T1. The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage line VL2 to which a low-potential voltage (hereinafter referred to as a second power supply voltage) lower than a high-potential voltage (hereinafter referred to as a first power supply voltage) of a first voltage line VL1 is supplied.

The first transistor T1 adjusts a current flowing from the first voltage line VL1, to which the first power supply voltage is supplied, to the light emitting diode EL according to a voltage difference between a gate electrode and the source electrode thereof. For example, the first transistor T1 may be a driving transistor for driving the light emitting diode EL. The first transistor T1 may have the gate electrode connected to a source electrode of a second transistor T2, the source electrode connected to the first electrode of the light emitting diode EL, and a drain electrode connected to the first voltage line VL1 to which the first power supply voltage is applied.

The second transistor T2 is turned on by a scan signal of a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal of a second scan line SL2 to connect an initialization voltage line VIL to the first end of the light emitting diode EL. The third transistor T3 may have a gate electrode connected to the second scan line SL2, a drain electrode connected to the initialization voltage line VIL, and a source electrode connected to the first end of the light emitting diode EL or the source electrode of the first transistor T1.

In an embodiment, the source electrode and the drain electrode of each of the transistors T1 to T3 are not limited to the above description, and the opposite may also be the case. In addition, each of the transistors T1 to T3 may be formed as a thin-film transistor. In addition, although each of the transistors T1 to T3 is mainly described as an N-type metal-oxide-semiconductor field-effect transistor (MOSFET) in FIG. 3, the disclosure is not limited thereto. For example, each of the transistors T1 to T3 may also be formed as a P-type MOSFET, or some of the transistors T1 to T3 may be formed as N-type MOSFETs, and the others may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of a pixel PX of the display device 10 according to the embodiment will now be described in detail with further reference to other drawings.

Figure 4:
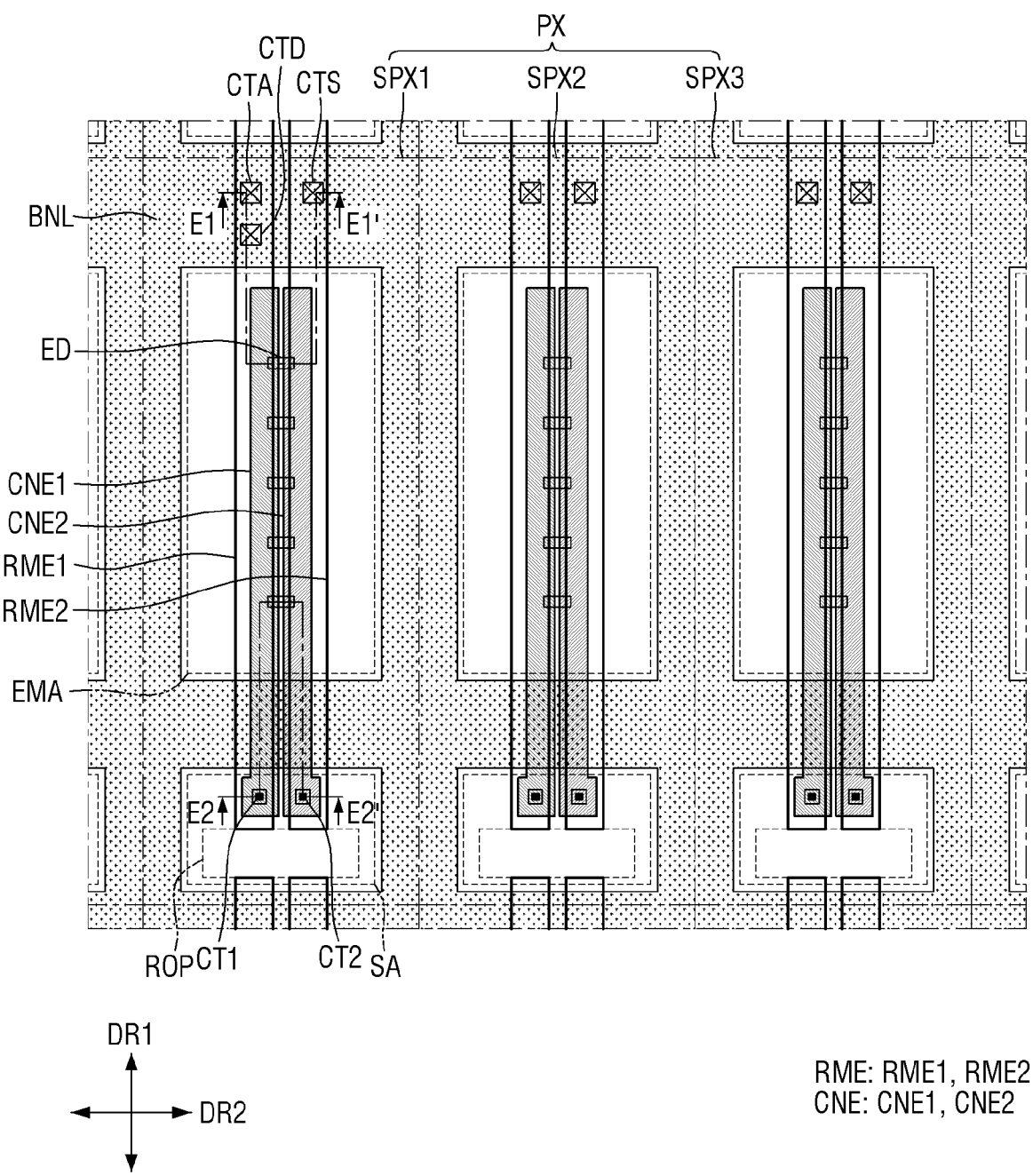
FIG. 4 is a schematic plan view of a pixel of the display device according to the embodiment.

FIG. 4 is a schematic plan view of a pixel PX of the display device 10 according to the embodiment. FIG. 4 illustrates the planar arrangement of electrodes RME (RME1 and RME2), bank patterns BP1 and BP2, a bank layer BNL, light emitting elements ED, and connection electrodes CNE (CNE1 and CNE2) disposed in a pixel PX of the display device 10.

Referring to FIG. 4, each of the pixels PX of the display device 10 may include subpixels SPXn. For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may also emit light of a same color. In an embodiment, the subpixels SPXn may emit blue light. Although FIG. 4 illustrates that a pixel PX includes three subpixels SPXn, the disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. Light emitting elements ED may be disposed in each subpixel SPXn, and an area where the light emitting elements ED are disposed and an area adjacent to this area may form the emission area EMA.

Although the respective emission areas EMA of the subpixels SPXn have substantially a same area in the drawing, the disclosure is not limited thereto. In some embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of a corresponding subpixel SPXn may be disposed on a lower side of the emission area EMA which is the second side in the first direction DR1. The emission area EMA and the sub-area SA may be alternately arranged in the first direction DR1, and the sub-area SA may be disposed between the emission areas EMA of different subpixels SPXn spaced apart from each other in the first direction DR1. For example, the emission area EMA and the sub-area SA may be alternately arranged in the first direction DR1 and may each be repeatedly arranged in the second direction DR2. However, the disclosure is not limited thereto, and the arrangement of the emission areas EMA and the sub-areas SA in pixels PX may also be different from that in FIG. 4.

Light may not exit from the sub-area SA because the light emitting elements ED are not disposed in the sub-area SA, but parts of the electrodes RME disposed in each subpixel SPXn may be disposed in the sub-area SA. The electrodes RME disposed in different subpixels SPXn may be separated from each other in a separation part ROP of the sub-area SA.

Wirings and circuit elements of a circuit layer disposed in each pixel PX and connected to the light emitting diodes EL may be connected to each of the first to third subpixels SPX1 to SPX3. However, the wirings and the circuit elements are not disposed to correspond to an area occupied by each subpixel SPXn or each emission area EMA but may be disposed regardless of the positions of the emission areas EMA in a pixel PX.

The bank layer BNL may surround the subpixel SPXn, the emission areas EMA, and the sub-areas SA. The bank layer BNL may be disposed at boundaries between the subpixels SPXn adjacent to each other in the first direction DR1 and the second direction DR2 and also may be disposed at boundaries between the emission areas EMA and the sub-areas SA. The subpixels SPXn, the emission areas EMA, and the sub-areas SA of the display device 10 may be areas separated by the arrangement of the bank layer BNL. Distances between the subpixels SPXn, the emission areas EMA, and the sub-areas SA may vary according to a width of the bank layer BNL.

The bank layer BNL may include parts extending in the first direction DR1 and the second direction DR2 in a plan view to form a grid pattern in the entire display area DPA. The bank layer BNL may be disposed at the boundary of each subpixel SPXn to separate neighboring subpixels SPXn from each other. In addition, the bank layer BNL may surround the emission area EMA and the sub-area SA disposed in each subpixel SPXn to separate them from each other.

Figure 5:
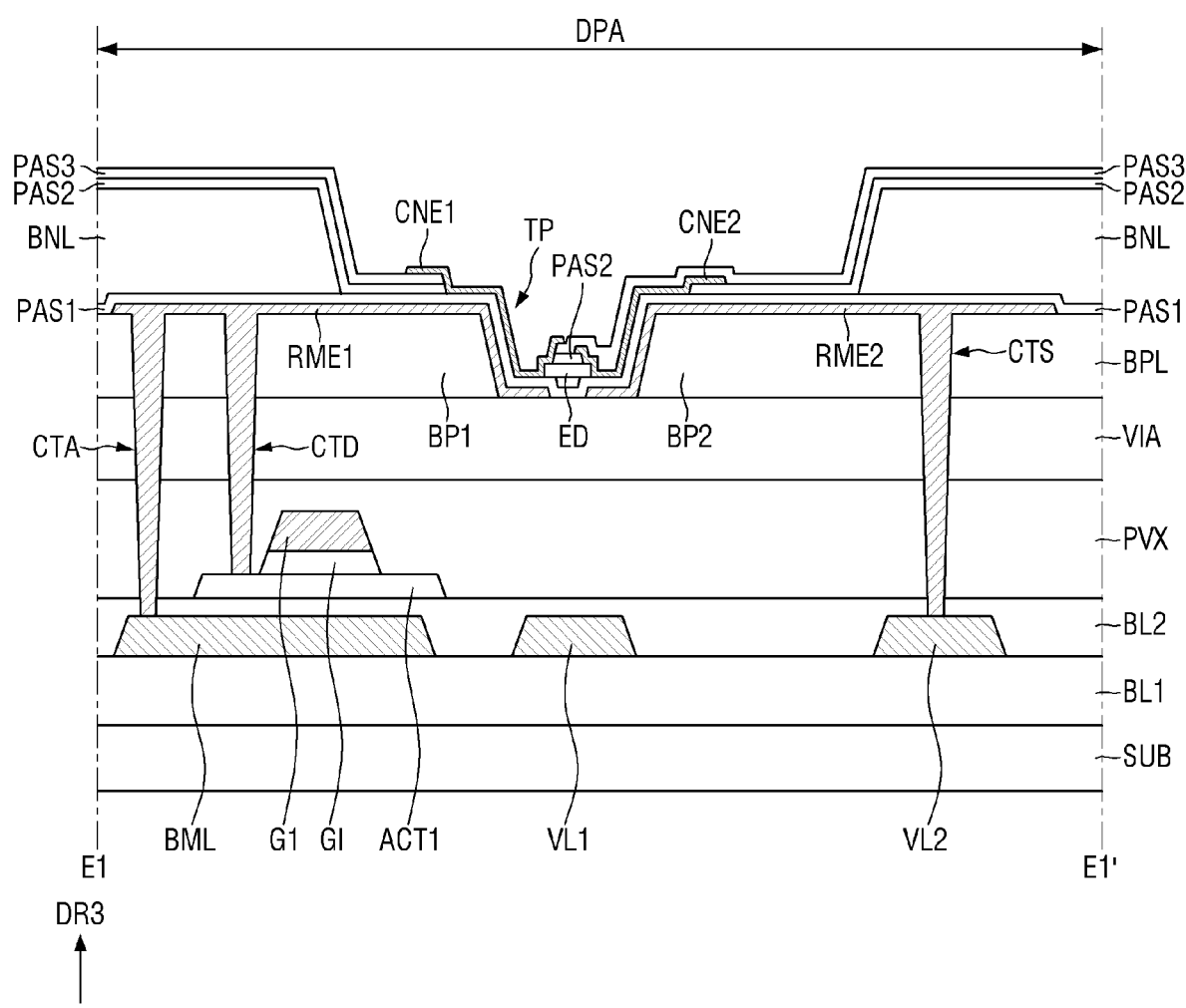
FIG. 5 is a schematic cross-sectional view taken along line E1-E1' of FIG. 4.
Figure 6:
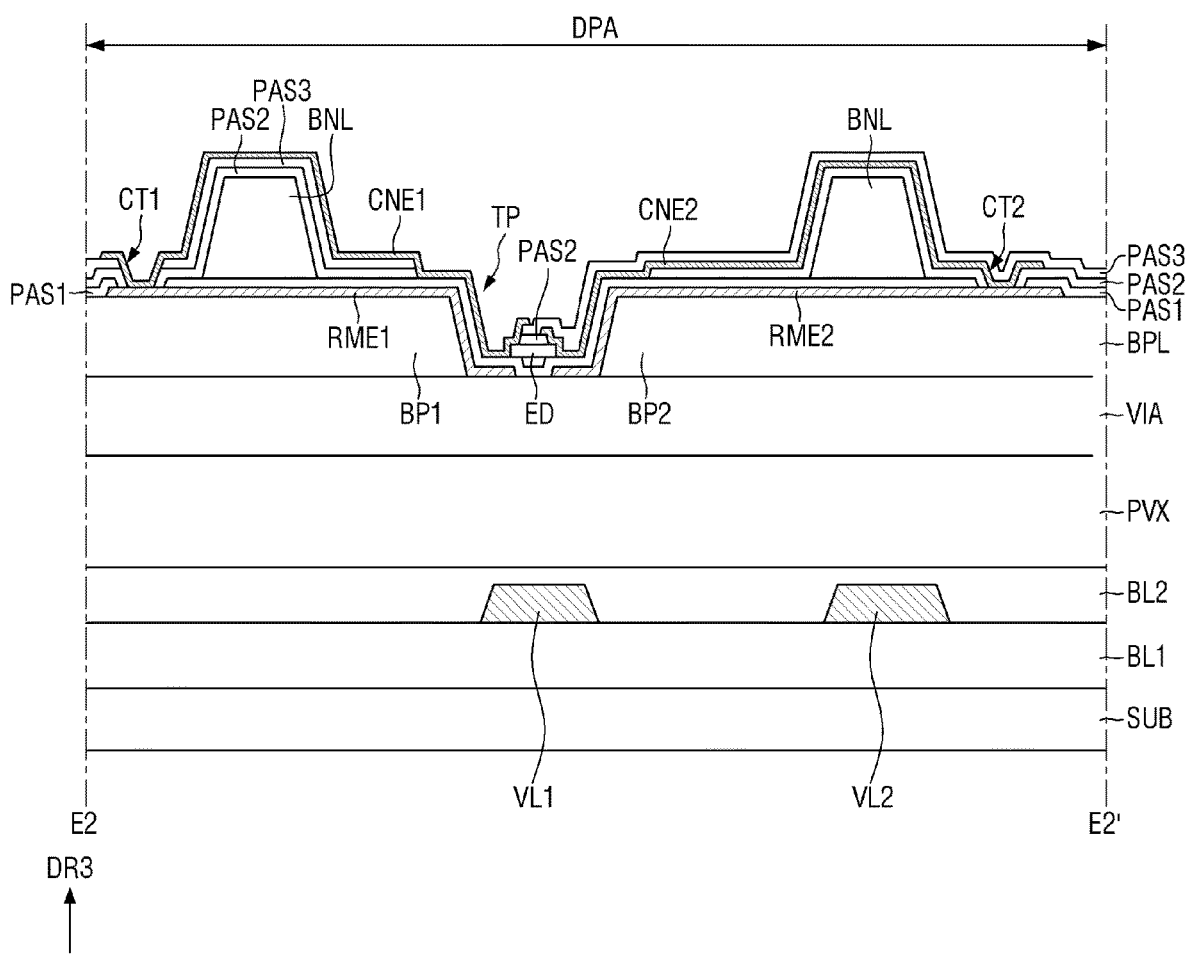
FIG. 6 is a schematic cross-sectional view taken along line E2-E2' of FIG. 4.
Figure 7:
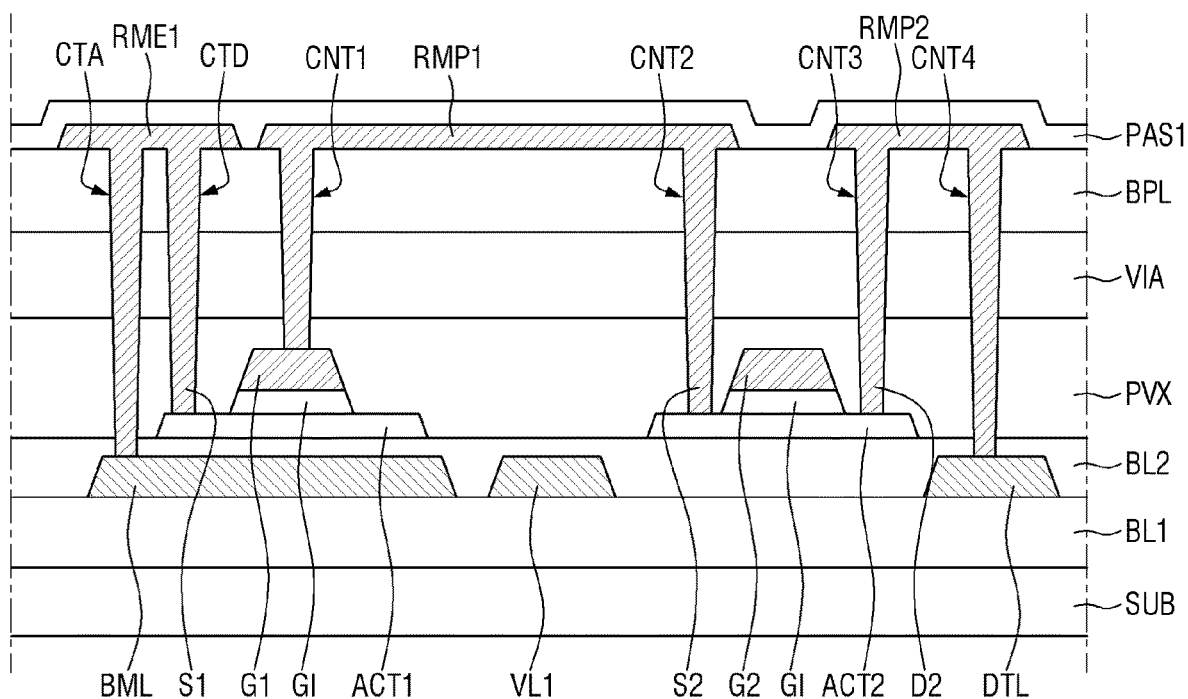
FIGS. 7 and 8 are schematic cross-sectional views of a part of the display device according to the embodiment.
Figure 8:
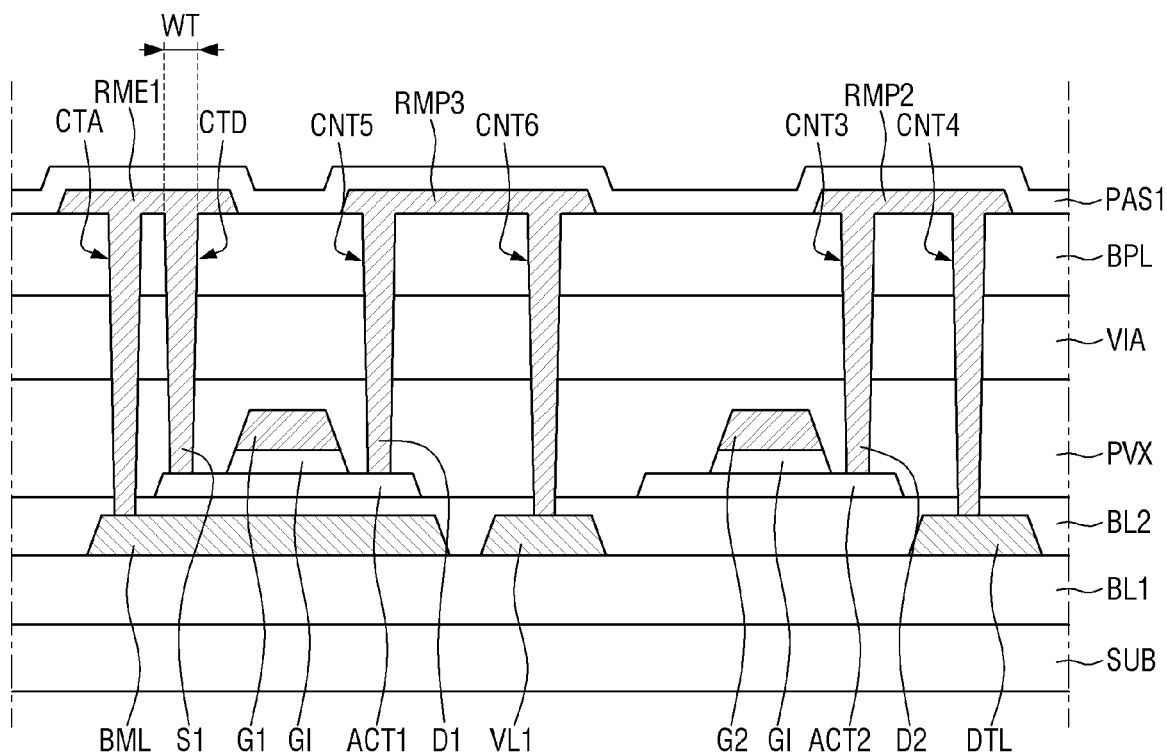
Figure 9:
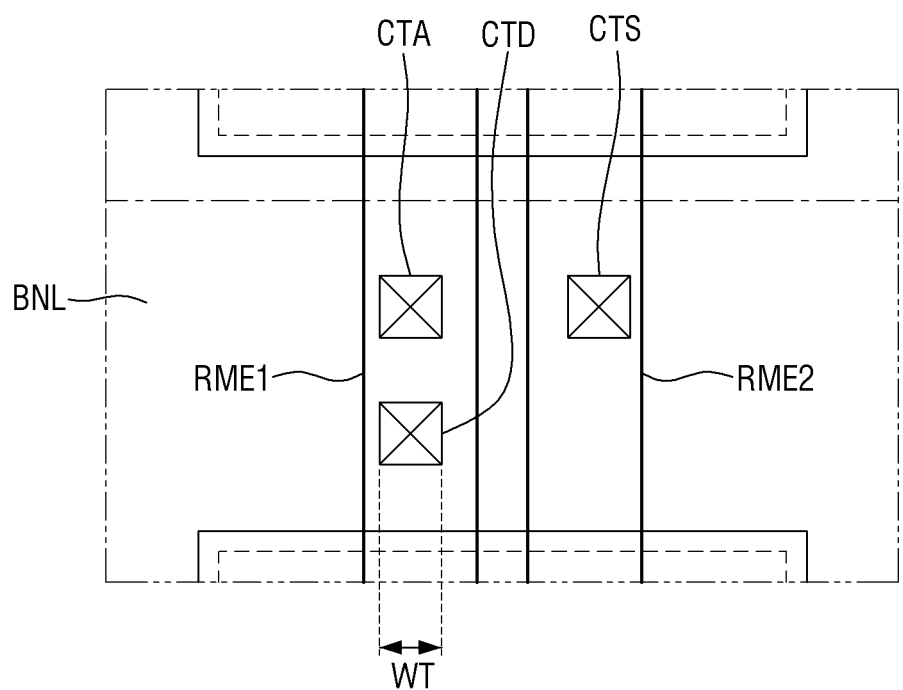
FIG. 9 is a schematic plan view illustrating electrode contact holes of the display device according to the embodiment.

FIG. 5 is a schematic cross-sectional view taken along line E1-E1' of FIG. 4. FIG. 6 is a schematic cross-sectional view taken along line E2-E2' of FIG. 4. FIGS. 7 and 8 are schematic cross-sectional views of a part of the display device 10 according to the embodiment. FIG. 9 is a schematic plan view illustrating electrode contact holes CTA, CTD, and CTS of the display device 10 according to the embodiment.

FIG. 5 illustrates a cross section across ends (or both ends) of a light emitting element ED and the electrode contact holes CTA, CTD and CTS disposed in the first subpixel SPX1. FIG. 6 illustrates a cross section across ends of a light emitting element ED and contact parts CT1 and CT2 disposed in the first subpixel SPX1. FIGS. 7 and 8 are schematic cross-sectional views illustrating the arrangement of a first transistor T1 and a second transistor T2 in the display device 10. FIG. 9 is a schematic plan view illustrating the electrode contact holes CTA, CTD, and CTS.

Referring to FIGS. 4 and 5 to 9, the display device 10 may include a first substrate SUB and a semiconductor layer, conductive layers and insulating layers disposed on the first substrate SUB. In addition, the display device 10 may include the electrodes RME (RME1 and RME2), the light emitting elements ED, and the connection electrodes CNE (CNE1 and CNE2). The semiconductor layer, the conductive layers, and the insulating layers may constitute a circuit layer of the display device 10.

The first substrate SUB may be an insulating substrate. The first substrate SUB may be made of (or include) an insulating material such as glass, quartz, or polymer resin. In addition, the first substrate SUB may be a rigid substrate, but may also be a flexible substrate that can be bent, folded, rolled, etc. The first substrate SUB may include the display area DPA and the non-display area NDA surrounding the display area DPA, and the display area DPA may include the emission area EMA and the sub-area SA which is a part of the non-emission area.

A first buffer layer BL1 may be disposed on the first substrate SUB. The first buffer layer BL1 may be formed on the first substrate SUB to protect transistors of the pixels PX from moisture introduced thereinto through the first substrate SUB which is vulnerable to moisture penetration, and may perform a surface planarization function.

A first conductive layer may be disposed on the first buffer layer BL1. The first conductive layer may include a bottom metal layer BML, a first voltage line VL1, a second voltage line VL2, and a data line DTL. The bottom metal layer BML is overlapped by (or overlaps) an active layer ACT1 of the first transistor T1. The bottom metal layer BML may prevent light from entering the first active layer ACT1 of the first transistor T1 or may be electrically connected to the first active layer ACT1 to stabilize electrical characteristics of the first transistor T1. However, the bottom metal layer BML may also be omitted.

A high-potential voltage (or a first power supply voltage) supplied to a first electrode RME1 may be applied to the first voltage line VL1, and a low-potential voltage (or a second power supply voltage) supplied to a second electrode RME2 may be applied to the second voltage line VL2. The first voltage line VL1 may be electrically connected to the first active layer ACT1 of the first transistor T1. The second voltage line VL2 may be directly connected to the second electrode RME2 to be described later.

The data line DTL may be electrically connected to the second transistor T2. A data signal transmitted to the second transistor T2 may be transmitted to the data line DTL.

Each of the first voltage line VL1, the second voltage line VL2, and the data line DTL may be electrically connected to the first transistor T1, the second transistor T2, or an electrode RME through an electrode RME or an electrode pattern RMP1, RMP2 or RMP3 of a third conductive layer.

A second buffer layer BL2 may be disposed on the first conductive layer and the first substrate SUB. The second buffer layer BL2 may be formed on the first substrate SUB to protect the transistors of the pixels PX from moisture introduced thereinto through the first substrate SUB which is vulnerable to moisture penetration, and may perform a surface planarization function.

The semiconductor layer is disposed on the second buffer layer BL2. The semiconductor layer may include the first active layer ACT1 of the first transistor T1 and a second active layer ACT2 of the second transistor T2. The first active layer ACT1 and the second active layer ACT2 may respectively be partially overlapped by a first gate electrode G1 and a second gate electrode G2 of a second conductive layer which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the disclosure is not limited thereto, and the display device 10 may include a greater number of transistors.

A first gate insulating layer GI is disposed on the semiconductor layer in the display area DPA. The first gate insulating layer GI may not be disposed in the pad area PDA. The first gate insulating layer GI may serve as a gate insulating film of each of the transistors T1 and T2. In the drawings, the first gate insulating layer GI is patterned together with the gate electrodes G1 and G2 of the second conductive layer to be described later and is partially disposed between the second conductive layer and the active layers ACT1 and ACT2 of the semiconductor layer. However, the disclosure is not limited thereto. In some embodiments, the first gate insulating layer GI may be entirely disposed on the second buffer layer BL2.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction, and the second gate electrode G2 may overlap a channel region of the second active layer ACT2 in the third direction DR3 which is the thickness direction. Although not illustrated in the drawings, the second conductive layer may further include an electrode of a storage capacitor.

A passivation layer PVX is disposed on the second conductive layer, the semiconductor layer, and the second buffer layer BL2. The passivation layer PVX may function as an insulating film between the second conductive layer and other layers disposed on the second conductive layer and may protect the second conductive layer.

According to an embodiment, the passivation layer PVX may include silicon nitride ($SiN_x$) having a low content of hydrogen (H). In the display device 10, the active layers ACT1 and ACT2 may include an oxide semiconductor, and the passivation layer PVX may include a material effective to secure element reliability of the transistors T1 and T2 and prevent moisture permeation from the outside.

Since the first gate insulating layer GI is patterned according to the shapes of the gate electrodes G1 and G2 of the second conductive layer, the passivation layer PVX may directly contact upper surfaces of the active layers ACT1 and ACT2. In case that the passivation layer PVX including silicon nitride ($SiN_x$) is formed during a fabrication process of the display device 10, hydrogen contained in the passivation layer PVX may be introduced into the active layers ACT1 and ACT2. In case that the amount of hydrogen introduced increases, element characteristics of the transistors T1 and T2 may be affected. The display device 10 according to the embodiment may include the passivation layer PVX including silicon nitride ($SiN_x$) and having a low content of hydrogen and may minimize a change in the element characteristics of the transistors T1 and T2 including the active layers ACT1 and ACT2 made of an oxide semiconductor. This will be described in more detail later.

Each of the first buffer layer BL1, the second buffer layer BL2, and the first gate insulating layer GI described above may be composed of inorganic layers stacked alternately. For example, each of the first buffer layer BL1, the second buffer layer BL2, and the first gate insulating layer GI may be a double layer in which inorganic layers including at least any of silicon oxide ($SiO_x$), silicon nitride ($SiN_x$) and silicon oxynitride ($SiO_xN_y$) are stacked or may be a multilayer in which the inorganic layers are alternately stacked. However, the disclosure is not limited thereto, and each of the first buffer layer BL1, the second buffer layer BL2, and the first gate insulating layer GI may also be composed of an inorganic layer including any of the above insulating materials.

A via layer VIA is disposed on the passivation layer PVX in the display area DPA. The via layer VIA may include an organic insulating material such as polyimide (PI) to compensate for a step difference due to the conductive layers thereunder and may form a flat upper surface. However, in some embodiments, the via layer VIA may be omitted.

A bank pattern layer BPL may be disposed on the via layer VIA. The bank pattern layer BPL may be partially etched to include a trench part TP exposing a part of the upper surface of the via layer VIA and may include bank patterns BP1 and BP2 separated from each other by the trench part TP. The trench part TP may be disposed in the emission area EMA of each subpixel SPXn, and a part of each of the bank patterns BP1 and BP2 may be disposed in the emission area EMA.

For example, the bank patterns BP1 and BP2 may include a first bank pattern BP1 and a second bank pattern BP2 partially spaced apart from each other in the second direction DR2 in the emission area EMA of each subpixel SPXn. The first bank pattern BP1 may be disposed on a left side of the center of the emission area EMA which is a first side in the second direction DR2, and the second bank pattern BP2 may be spaced apart from the first bank pattern BP1 and may be disposed on a right side of the center of the emission area EMA which is a second side in the second direction DR2. The first bank pattern BP1 and the second bank pattern BP2 may be alternately disposed in the second direction DR2. Light emitting elements ED may be disposed between the first bank pattern BP1 and the second bank pattern BP2.

The bank patterns BP1 and BP2 may be directly disposed on the via layer VIA, and at least a part of each of the bank patterns BP1 and BP2 may protrude from the upper surface of the via layer VIA. The protruding part of each of the bank patterns BP1 and BP2 may have inclined or curved side surfaces, and light emitted from the light emitting elements ED may be reflected upward from the via layer VIA by the electrodes RME disposed on the bank patterns BP1 and BP2. Unlike in the drawings, each of the bank patterns BP1 and BP2 may also have a semicircular or semielliptical shape with a curved outer surface in a cross-sectional view. The bank patterns BP1 and BP2 may include, but are not limited to, an organic insulating material such as polyimide (PI).

The third conductive layer may be disposed on the bank pattern layer BPL. The third conductive layer may include the electrodes RME and the electrode patterns RMP1 to RMP3. The electrodes RME and the electrode patterns RMP1 to RMP3 may be electrically connected to the conductive layers or the semiconductor layer under the via layer VIA. The electrodes RME may be electrically connected to the light emitting elements ED and the connection electrodes CNE to be described later.

The electrodes RME (RME1 and RME2) extend in a direction and are disposed in each subpixel SPXn. The electrodes RME1 and RME2 may extend in the first direction DR1 to lie in the emission area EMA and the sub-area SA of each subpixel SPXn and may be spaced apart from each other in the second direction DR2.

The display device 10 may include the first electrode RME1 and the second electrode RME2 disposed in each subpixel SPXn. The first electrode RME1 is disposed on the left side of the center of the emission area EMA, and the second electrode RME2 is spaced apart from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to lie in a corresponding subpixel SPXn and a part of the sub-area SA. The first electrodes RME1 and the second electrodes RME2 of different subpixels SPXn may be spaced apart from each other by the separation part ROP located in the sub-area SA of a subpixel SPXn.

Although two electrodes RME extend in the first direction DR1 in each subpixel SPXn in the drawings, the disclosure is not limited thereto. For example, in the display device 10, a greater number of electrodes RME may be disposed in a subpixel SPXn, or the electrodes RME may be partially bent and may have a different width according to position.

The first electrode RME1 and the second electrode RME2 may be disposed on at least the inclined side surfaces of the bank patterns BP1 and BP2. In an embodiment, a distance between the first electrode RME1 and the second electrode RME2 in the second direction DR2 may be smaller than a distance between the bank patterns BP1 and BP2. At least a part of each of the first electrode RME1 and the second electrode RME2 may be directly disposed on the via layer VIA so that they lie in a same plane.

The light emitting elements ED disposed between the bank patterns BP1 and BP2 may emit light toward ends thereof, and the emitted light may travel toward the electrodes RME disposed on the bank patterns BP1 and BP2. Each electrode RME may have a structure in which a part thereof disposed on a bank pattern BP1 or BP2 can reflect light emitted from the light emitting elements ED. Each of the first electrode RME1 and the second electrode RME2 may cover at least one side surface of the bank pattern BP1 or BP2 to reflect light emitted from the light emitting elements ED.

Each of the electrodes RME may directly contact the first conductive layer or the semiconductor layer through an electrode contact hole CTA, CTD, or CTS in a part of the electrode RME overlapping the bank layer BNL between the emission area EMA and the sub-area SA. A first electrode contact hole CTD and a third electrode contact hole CTA may be formed in an area in which the bank layer BNL and the first electrode RME1 overlap each other, and a second electrode contact hole CTS may be formed in an area in which the bank layer BNL and the second electrode RME2 overlap each other. The first electrode RME1 may contact the first active layer ACT1 of the first transistor T1 through the first electrode contact hole CTD penetrating the bank pattern layer BPL, the via layer VIA, and the passivation layer PVX. The first electrode RME1 may contact the bottom metal layer BML of the first conductive layer through the third electrode contact hole CTA penetrating the bank pattern layer BPL, the via layer VIA, the passivation layer PVX, and the second buffer layer BL2. The first electrode RME1 may serve as a first source electrode S1 of the first transistor T1. The first active layer ACT1 of the first transistor T1 may be electrically connected to the bottom metal layer BML through the first electrode RME1.

The second electrode RME2 may contact the second voltage line VL2 of the first conductive layer through the second electrode contact hole CTS penetrating the bank pattern layer BPL, the via layer VIA, the passivation layer PVX, and the second buffer layer BL2. The first electrode RME1 may be electrically connected to the first transistor T1 to receive the first power supply voltage, and the second electrode RME2 may be electrically connected to the second voltage line VL2 to receive the second power supply voltage.

The electrode patterns RMP1 to RMP3 may be disposed on the bank pattern layer BPL and may directly contact the first conductive layer, the second conductive layer, or the semiconductor layer thereunder. For example, the electrode patterns RMP1 to RMP3 may include a first electrode pattern RMP1 electrically connected to the first gate electrode G1 of the first transistor T1 and the second active layer ACT2 of the second transistor T2, a second electrode pattern RMP2 electrically connected to the second active layer ACT2 of the second transistor T2 and the data line DTL, and a third electrode pattern RMP3 electrically connected to the first active layer ACT1 of the first transistor T1 and the first voltage line VL1.

The first electrode pattern RMP1 may contact the first gate electrode G1 through a first contact hole CNT1 penetrating the bank pattern layer BPL, the via layer VIA, and the passivation layer PVX and may contact the second active layer ACT2 through a second contact hole CNT2 penetrating the bank pattern layer BPL, the via layer VIA, and the passivation layer PVX. The first electrode pattern RMP1 may serve as a second source electrode S2 of the second transistor T2. The first transistor T1 and the second transistor T2 may be electrically connected to each other through the first electrode pattern RMP1.

The second electrode pattern RMP2 may contact the second active layer ACT2 through a third contact hole CNT3 penetrating the bank pattern layer BPL, the via layer VIA, and the passivation layer PVX and may contact the data line DTL through a fourth contact hole CNT4 penetrating the bank pattern layer BPL, the via layer VIA, and the passivation layer PVX. The second electrode pattern RMP2 may serve as a second drain electrode D2 of the second transistor T2. The second transistor T2 and the data line DTL may be electrically connected to each other through the second electrode pattern RMP2.

The third electrode pattern RMP3 may contact the first active layer ACT1 through a fifth contact hole CNT5 penetrating the bank pattern layer BPL, the via layer VIA, and the passivation layer PVX and may contact the first voltage line VL1 through a sixth contact hole CNT6 penetrating the bank pattern layer BPL, the via layer VIA, the passivation layer PVX, and the second buffer layer BL2. The third electrode pattern RMP3 may serve as a first drain electrode D1 of the first transistor T1. The first transistor T1 and the first voltage line VL1 may be electrically connected to each other through the third electrode pattern RMP3.

The electrodes RME and the electrode patterns RMP1 to RMP3 of the third conductive layer may include a conductive material having high reflectivity. For example, each of the electrodes RME and the electrode patterns RMP1 to RMP3 may include a metal such as silver (Ag), copper (Cu), or aluminum (Al), may be an alloy including aluminum (Al), nickel (Ni), or lanthanum (La), or may have a structure in which a metal layer such as titanium (Ti), molybdenum (Mo), or niobium (Nb) and the above alloy are stacked. In some embodiments, each of the electrodes RME and the electrode patterns RMP1 to RMP3 may be a double layer or a multilayer in which an alloy including aluminum (Al) and at least one metal layer made of titanium (Ti), molybdenum (Mo), or niobium (Nb) are stacked.

However, the disclosure is not limited thereto, and each of the electrodes RME and the electrode patterns RMP1 to RMP3 may further include a transparent conductive material. For example, each of the electrodes RME and the electrode patterns RMP1 to RMP3 may include a material such as ITO, IZO, or ITZO. In some embodiments, each of the electrodes RME and the electrode patterns RMP1 to RMP3 may have a structure in which a transparent conductive material and a metal layer having high reflectivity are each stacked in one or more layers, or may be formed as a single layer including them. For example, each of the electrodes RME and the electrode patterns RMP1 to RMP3 may have a stacked structure of ITO/Ag/ITO, ITO/Ag/IZO, or ITO/Ag/ITZO/IZO. The electrodes RME of the third conductive layer may be electrically connected to the light emitting elements ED and may reflect a part of the light emitted from the light emitting elements ED in an upward direction of the first substrate SUB.

The electrodes RME and the electrode patterns RMP1 to RMP3 of the third conductive layer may contact the conductive layers or the semiconductor layer under the via layer VIA through the electrode contact holes CTA, CTD, and CTS or the contact holes CNT1 to CNT6 penetrating the bank pattern layer BPL, the via layer VIA, and the passivation layer PVX. During the process of fabricating the display device 10, the electrode contact holes CTA, CTD, and CTS and the contact holes CNT1 to CNT6 may be formed by an etching process performed after the bank pattern layer BPL is formed. In the etching process, the bank pattern layer BPL, the via layer VIA, and the passivation layer PVX may be simultaneously etched, and the first conductive layer, the second conductive layer, and the semiconductor layer may be partially exposed.

The first electrode contact hole CTD, the second contact hole CNT2, the third contact holes CNT3, and the fifth contact hole CNT5 may partially expose the active layers ACT1 and ACT2 of the semiconductor layer. In an embodiment, an etching process for forming contact holes may be performed as a dry etching process. The upper surfaces of the active layers ACT1 and ACT2 may be partially damaged by the etching process, and oxygen vacancies may be formed in the active layers ACT1 and ACT2. Hydrogen contained in the passivation layer PVX may flow into the oxygen vacancies formed in the active layers ACT1 and ACT2 and affect lengths of effective channel regions of the active layers ACT1 and ACT2. In particular, damage to the active layers ACT1 and ACT2 made of an oxide semiconductor may vary according to diameters of contact holes or electrode contact holes penetrating the passivation layer PVX, and the element characteristics of the transistors T1 and T2 may be changed accordingly. If the amount of hydrogen flowing from the passivation layer PVX into the active layers ACT1 and ACT2 increases according to conditions of the etching process for forming the contact holes, the diameter design of the contact holes may be limited. In the display device 10 according to the embodiment, the passivation layer PVX includes an insulating material having a low content of hydrogen. Therefore, it is possible to prevent the element characteristics of the active layers ACT1 and ACT2 made of an oxide semiconductor from being changed in the etching process for forming the contact holes. Accordingly, restrictions on the diameter design of the contact holes may be reduced, thus allowing the structure of each pixel PX to be designed freely.

According to an embodiment, the passivation layer PVX of the display device 10 may include silicon nitride ($SiN_x$) having a low content of hydrogen. The passivation layer PVX may be formed by depositing precursor materials for forming silicon nitride ($SiN_x$) and heat-treating the precursor materials. If hydrogen contained in the silicon nitride ($SiN_x$) is sufficiently discharged in the heat treatment process, the amount of hydrogen flowing into the active layers ACT1 and ACT2 may be reduced even if an etching process for forming contact holes is performed.

Silicon nitride ($SiN_x$) may contain an amount of hydrogen because silicon (Si) and nitrogen (N) form a bond with hydrogen (H). A bonding energy (Si—H) of silicon (Si) and hydrogen (H) is smaller than a bonding energy (N—H) of nitrogen (N) and hydrogen (H). If a bonding ratio (Si—H) of silicon (Si) and hydrogen (H) in the silicon nitride ($SiN_x$) increases, a large amount of hydrogen may be discharged in the heat treatment process.

The passivation layer PVX according to an embodiment may include silicon nitride ($SiN_x$), and the ratio ([Si—H]:[N—H]) of the number of silicon (Si)-hydrogen (H) bonds [Si—H] to the number of nitrogen (N)-hydrogen (H) bonds [N—H] may be in a range of about 1:0.6 to about 1:1.5. A thickness of the passivation layer PVX may be in a range of about 2500 Å to about 3500 Å, and the hydrogen content of the passivation layer PVX may be in a range of about $3.0 \times 10^{22}/cm^2$ to about $4.0 \times 10^{22}/cm^2$. The passivation layer PVX may include silicon nitride ($SiN_x$) having a relatively large number of silicon (Si)-hydrogen (H) bonds [Si—H] compared with the number of nitrogen (N)-hydrogen (H) bonds [N—H], and a sufficient amount of hydrogen may be discharged in the heat treatment process. Accordingly, in case that the contact holes CNT1 to CNT6 or the electrode contact holes CTA, CTD, and CTS are formed, the amount of hydrogen flowing from the passivation layer PVX into the active layers ACT1 and ACT2 may be reduced. The display device 10 can prevent a change in the element characteristics of the transistors T1 and T2, and the diameters of the contact holes CNT1 to CNT6 or the electrode contact holes CTA, CTD, and CTS can be designed freely.

For example, the passivation layer PVX may include silicon nitride ($SiN_x$) in which the ratio ([N—H]/[Si—H]) of the number of nitrogen (N)-hydrogen (H) bonds [N—H] to the number of silicon (Si)-hydrogen (H) bonds [Si—H] has a value of about 1.0. In addition, the passivation layer PVX may have a thickness of about 3000 Å and a hydrogen content of about $3.3 \times 10^{22}/cm^2$. In an embodiment including the passivation layer PVX having the above physical properties, the contact holes CNT1 to CNT6 or the electrode contact holes CTA, CTD, and CTS of the display device 10 may have a diameter WT of about 4 μm to about 10 μm measured on an upper surface of the bank pattern layer BPL. The transistors T1 and T2 may have element characteristics that they may be used as elements even if the physical properties of the passivation layer PVX and the diameters of the contact holes are within the above ranges. In the display device 10, the element characteristics of the transistors T1 and T2 can be secured regardless of whether the diameters of the contact holes are changed variously. In the display device 10, since the diameters of the contact holes disposed in each pixel PX can be adjusted, it is possible to secure an arrangement design space for the pixel PX and to realize a high-resolution display device.

A first insulating layer PAS1 may be disposed in the entire display area DPA and may be disposed on the bank pattern layer BPL and the electrodes RME. The first insulating layer PAS1 may protect the electrodes RME while insulating them from each other. Since the first insulating layer PAS1 covers the electrodes RME before the bank layer BNL is formed, it may prevent the electrodes RME from being damaged in the process of forming the bank layer BNL. The first insulating layer PAS1 may also prevent the light emitting elements ED disposed thereon from directly contacting other members and thus being damaged.

In an embodiment, the first insulating layer PAS1 may be stepped such that a part of an upper surface of the first insulating layer PAS1 is depressed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1. The first insulating layer PAS1 may be disposed between the bank patterns BP1 and BP2 and between the first electrode RME1 and the second electrode RME2 so that a part of the first insulating layer PAS1 is directly disposed on the via layer VIA.

The bank layer BNL may be disposed on the first insulating layer PAS1. The bank layer BNL may include parts extending in the first direction DR1 and the second direction DR2 and may surround each subpixel SPXn. The bank layer BNL may surround the emission area EMA and the sub-area SA of each subpixel SPXn to separate them from each other and may surround the outermost periphery of the display area DPA to separate the display area DPA and the non-display area NDA from each other. The bank layer BNL may be disposed in the entire display area DPA to form a grid pattern, and areas exposed by the bank layer BNL in the display area DPA may be the emission area EMA and the sub-area SA.

Similar to the bank patterns BP1 and BP2, the bank layer BNL may have a height (e.g., a predetermined or selected height). In some embodiments, an upper surface of the bank layer BNL may be at a greater height greater than those of the bank patterns BP1 and BP2, and a thickness of the bank layer BNL may be equal to or greater than those of the bank patterns BP1 and BP2. The bank layer BNL may prevent ink from overflowing into adjacent subpixels SPXn in an inkjet printing process during the fabrication process of the display device 10. Similar to the bank patterns BP1 and BP2, the bank layer BNL may include an organic insulating material such as polyimide.

The light emitting elements ED may be disposed in the emission area EMA. The light emitting elements ED may be disposed between the bank patterns BP1 and BP2 and may be spaced apart from each other in the first direction DR1. In an embodiment, the light emitting elements ED may extend in a direction, and ends thereof may be disposed on different electrodes RME, respectively. A length of each light emitting element ED may be greater than a distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The light emitting elements ED may be disposed on the first insulating layer PAS1. The light emitting elements ED may extend in a direction, and the direction in which the light emitting elements ED extend may be parallel to an upper surface of the first substrate SUB. As will be described later, each light emitting element ED may include semiconductor layers disposed in the extending direction, and the semiconductor layers may be sequentially disposed in a direction parallel to the upper surface of the first substrate SUB. However, the disclosure is not limited thereto. In case that the light emitting elements ED have a different structure, the semiconductor layers may be disposed in a direction perpendicular to the first substrate SUB.

The light emitting elements ED disposed in each subpixel SPXn may emit light of different wavelength bands depending on the materials that form the semiconductor layers described above. However, the disclosure is not limited thereto, and the light emitting elements ED disposed in each subpixel SPXn may also emit light of a same color by including the semiconductor layers made of a same material.

The light emitting elements ED may be electrically connected to the electrodes RME and the conductive layers under the via layer VIA by contacting the connection electrodes CNE (CNE1 and CNE2). The light emitting elements ED may emit light of a specific wavelength band in response to an electrical signal applied thereto.

A second insulating layer PAS2 may be disposed on the light emitting elements ED, the first insulating layer PAS1, and the bank layer BNL. The second insulating layer PAS2 may include a pattern part extending in the first direction DR1 between the bank patterns BP1 and BP2 and disposed on the light emitting elements ED. The pattern part may partially cover outer surfaces of the light emitting elements ED and may not cover side (e.g., both sides) or ends (or both ends) of the light emitting elements ED. The pattern part may form a linear or island-shaped pattern in each subpixel SPXn in a plan view. The pattern part of the second insulating layer PAS2 may protect the light emitting elements ED while fixing the light emitting elements ED in the fabrication process of the display device 10. In addition, the second insulating layer PAS2 may fill a space between each light emitting element ED and the first insulating layer PAS1 under the light emitting element ED. In addition, a part of the second insulating layer PAS2 may be disposed on the bank layer BNL and in the sub-area SA.

The connection electrodes CNE (CNE1 and CNE2) may be disposed on the electrodes RME and the bank patterns BP1 and BP2. The connection electrodes CNE may extend in a direction and may be spaced apart from each other. Each of the connection electrodes CNE may contact the light emitting elements ED and may be electrically connected to the third conductive layer.

The connection electrodes CNE may include a first connection electrode CNE1 and a second connection electrode CNE2 disposed in each subpixel SPXn. The first connection electrode CNE1 may extend in the first direction DR1 and may be disposed on the first electrode RME1 or the first bank pattern BP1. The first connection electrode CNE1 may partially overlap the first electrode RME1 and may extend from the emission area EMA to the sub-area SA beyond the bank layer BNL. The second connection electrode CNE2 may extend in the first direction DR1 and may be disposed on the second electrode RME2 or the second bank pattern BP2. The second connection electrode CNE2 may partially overlap the second electrode RME2 and may extend from the emission area EMA to the sub-area SA beyond the bank layer BNL. The first connection electrode CNE1 and the second connection electrode CNE2 may contact the light emitting elements ED and may be electrically connected to the electrodes RME or a conductive layer under the electrodes RME.

For example, each of the first connection electrode CNE1 and the second connection electrode CNE2 may be disposed on side surfaces of the second insulating layer PAS2 and may contact the light emitting elements ED. The first connection electrode CNE1 may partially overlap the first electrode RME1 and may contact ends of the light emitting elements ED. The second connection electrode CNE2 may partially overlap the second electrode RME2 and may contact other ends of the light emitting elements ED. The connection electrodes CNE may be disposed over the emission area EMA and the sub-area SA. The connection electrodes CNE may contact the light emitting elements ED in a part thereof disposed in the emission area EMA and may be electrically connected to the electrodes RME in a part thereof disposed in the sub-area SA.

According to an embodiment, in the display device 10, each connection electrode CNE may contact an electrode RME through a contact part CT1 or CT2 disposed in the sub-area SA. The first connection electrode CNE1 may contact the first electrode RME1 through a first contact part CT1 penetrating the first insulating layer PAS1, the second insulating layer PAS2, and the third insulating layer PAS3 in the sub-area SA. The second connection electrode CNE2 may contact the second electrode RME2 through a second contact part CT2 penetrating the first insulating layer PAS1 and the second insulating layer PAS2 in the sub-area SA. The connection electrodes CNE may be electrically connected to the third conductive layer through the electrodes RME, respectively. The first connection electrode CNE1 may be electrically connected to the first transistor T1 to receive the first power supply voltage, and the second connection electrode CNE2 may be electrically connected to the second voltage line VL2 to receive the second power supply voltage. Each connection electrode CNE may contact the light emitting elements ED in the emission area EMA and transmit a power supply voltage to the light emitting elements ED.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

A third insulating layer PAS3 is disposed on the second connection electrode CNE2 and the second insulating layer PAS2. The third insulating layer PAS3 may be entirely disposed on the second insulating layer PAS2 to cover the second connection electrode CNE2, and the first connection electrode CNE1 may be disposed on the third insulating layer PAS3. The third insulating layer PAS3 may be entirely disposed on the via layer VIA except for an area thereof where the second connection electrode CNE2 is disposed. The third insulating layer PAS3 may insulate the first connection electrode CNE1 and the second connection electrode CNE2 from each other so that they do not directly contact each other.

Although not illustrated in the drawings, another insulating layer may be further disposed on the third insulating layer PAS3 and the first connection electrode CNE1. The other insulating layer may protect members disposed on the first substrate SUB from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked. In an embodiment, each of the first insulating layer PAS1, the second insulating layer PAS2, and the third insulating layer PAS3 may be one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material, or some thereof may be made of a same material while the others are made of different materials, or all of them may be made of different materials.

Figure 10:
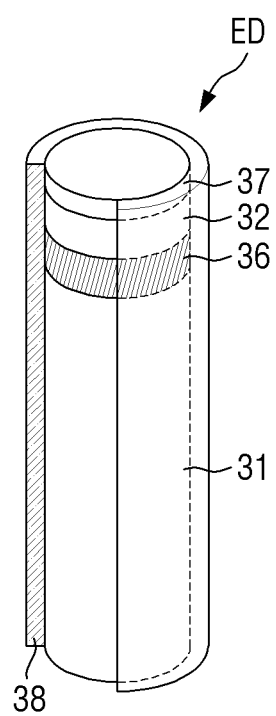
FIG. 10 is a schematic perspective view of a light emitting element according to an embodiment.

FIG. 10 is a schematic view of a light emitting element ED according to an embodiment.

Referring to FIG. 10, the light emitting element ED may be a light emitting diode. Specifically, the light emitting element ED may be an inorganic light emitting diode having a size of nanometers to micrometers and made of an inorganic material. In case that an electric field is formed in a specific direction between two electrodes facing each other, the light emitting element ED may be aligned between the two electrodes in which polarities are formed.

The light emitting element ED according to the embodiment may extend in a direction. The light emitting element ED may be shaped like a cylinder, a rod, a wire, a tube, or the like. However, the shape of the light emitting element ED is not limited thereto, and the light emitting element ED may also have various shapes including the shape of a polyprism such as a cube, a rectangular parallelepiped, and a hexagonal prism, and a shape extending in a direction and having a partially inclined outer surface.

The light emitting element ED may include a semiconductor layer doped with impurities of a conductivity type (e.g., a p type or an n type). The semiconductor layer may receive an electrical signal from an external power source and emit light in a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any or more of AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers and, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with an n-type dopant. The semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which barrier layers and well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN, AlGaInN, or InGaN. In particular, in case that the light emitting layer 36 has a multiple quantum well structure in which a barrier layer and a well layer are alternately stacked, the barrier layer may include a material such as AlGaN or AlGaInN, and the well layer may include a material such as GaN, InGaN, or AlInN.

The light emitting layer 36 may also have a structure in which a semiconductor material having a large band gap energy and a semiconductor material having small band gap energy are alternately stacked or may include different group III to V semiconductor materials depending on the wavelength band of light that it emits. Light emitted from the light emitting layer 36 is not limited to light in a blue wavelength band. In some embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may at least surround an outer surface of at least the light emitting layer 36 but may expose ends of the light emitting element ED in a longitudinal direction. In addition, an upper surface of the insulating film 38 may also be rounded in an area thereof adjacent to at least one end of the light emitting element ED, in a cross-sectional view.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawing, the disclosure is not limited thereto. In some embodiments, the insulating film 38 may be formed in a multilayer structure in which layers are stacked.

The insulating film 38 may protect the semiconductor layers and the electrode layer of the light emitting element ED. The insulating film 38 may prevent an electrical short circuit that may occur in the light emitting layer 36 in case that the light emitting layer 36 directly contacts an electrode through which an electrical signal is transmitted to the light emitting element ED. In addition, the insulating film 38 may prevent a reduction in luminous efficiency of the light emitting element ED.

In addition, an outer surface of the insulating film 38 may be treated. The light emitting element ED may be sprayed onto electrodes in a state where it is dispersed in an ink, and may be aligned. Here, the surface of the insulating film 38 may be hydrophobically or hydrophilically treated so that the light emitting element ED remains separate from other adjacent light emitting elements ED in the ink without agglomerating with them.

A method of fabricating the display device 10 will now be described with reference to other drawings.

Figure 11:
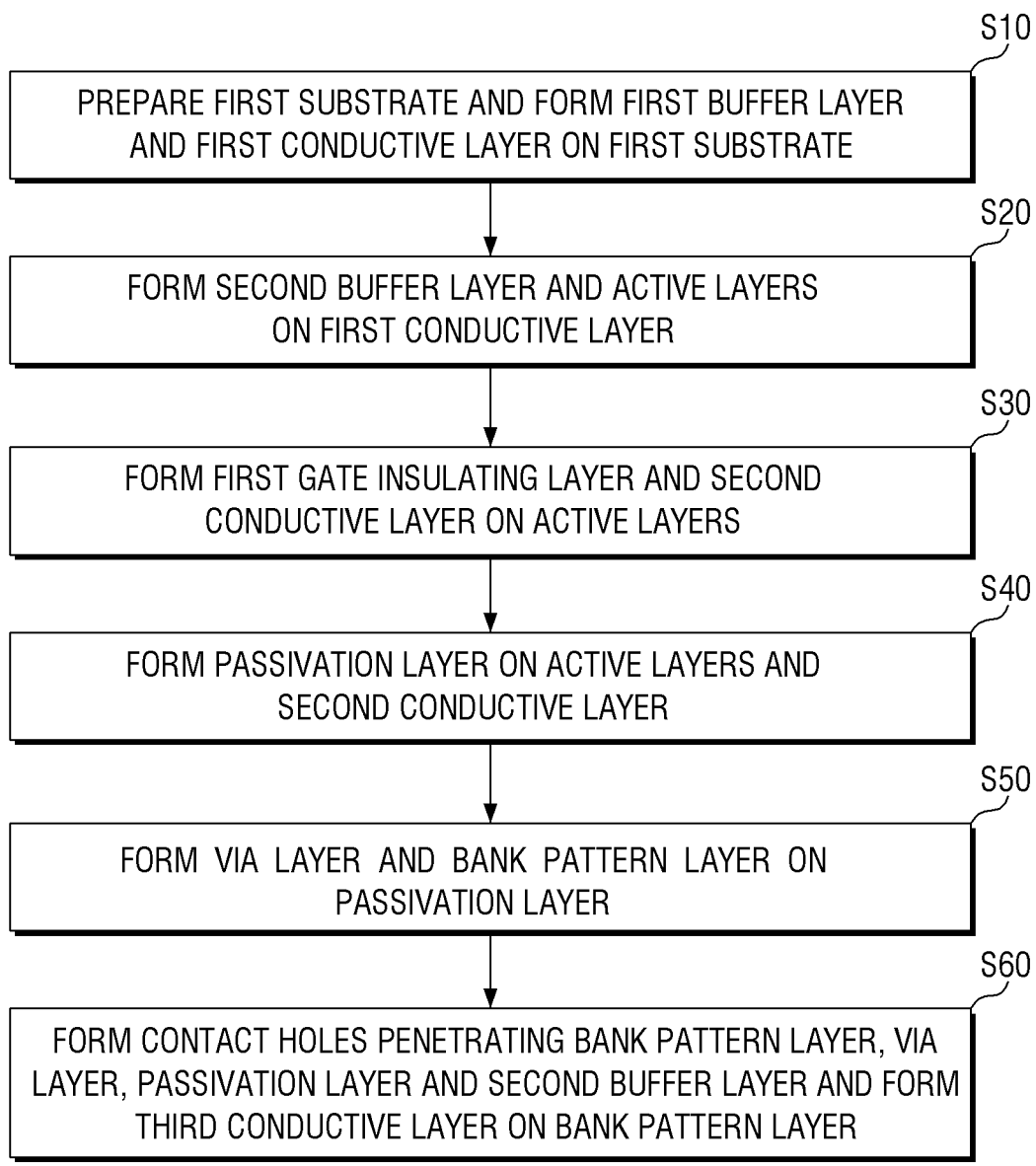
FIG. 11 is a schematic flowchart illustrating a method of fabricating a display device according to an embodiment.

FIG. 11 is a schematic flowchart illustrating a method of fabricating a display device according to an embodiment.

Referring to FIG. 11, the method of fabricating the display device 10 according to the embodiment may include preparing a first substrate SUB and forming a first buffer layer BL1 and a first conductive layer on the first substrate SUB (operation S10), forming a second buffer layer BL2 and active layers ACT1 and ACT2 on the first conductive layer (operation S20), forming a first gate insulating layer GI and a second conductive layer on the active layers ACT1 and ACT2 (operation S30), forming a passivation layer PVX on the active layers ACT1 and ACT2 and the second conductive layer (operation S40), forming a via layer VIA and a bank pattern layer BPL on the passivation layer PVX (operation S50), and forming contact holes penetrating the bank pattern layer BPL, the via layer VIA, the passivation layer PVX, and the second buffer layer BL2 and forming a third conductive layer on the bank pattern layer BPL (operation S60).

The forming of the passivation layer PVX (operation S40) in the method of fabricating the display device 10 may include depositing precursor materials for forming the passivation layer PVX and heat-treating, the deposited layer. The passivation layer PVX may include silicon nitride ($SiN_x$) having a low content of hydrogen through a content ratio of the deposited precursor materials and the heat treatment process. The method of fabricating the display device 10 will now be described in more detail with further reference to other drawings.

FIGS. 12 to 19 are schematic cross-sectional views illustrating a part of a process of fabricating a display device according to an embodiment. FIGS. 12 to 19 sequentially illustrate some of fabrication processes corresponding to a schematic cross-sectional view of the display device 10 illustrated in FIG. 7.

Figure 12:
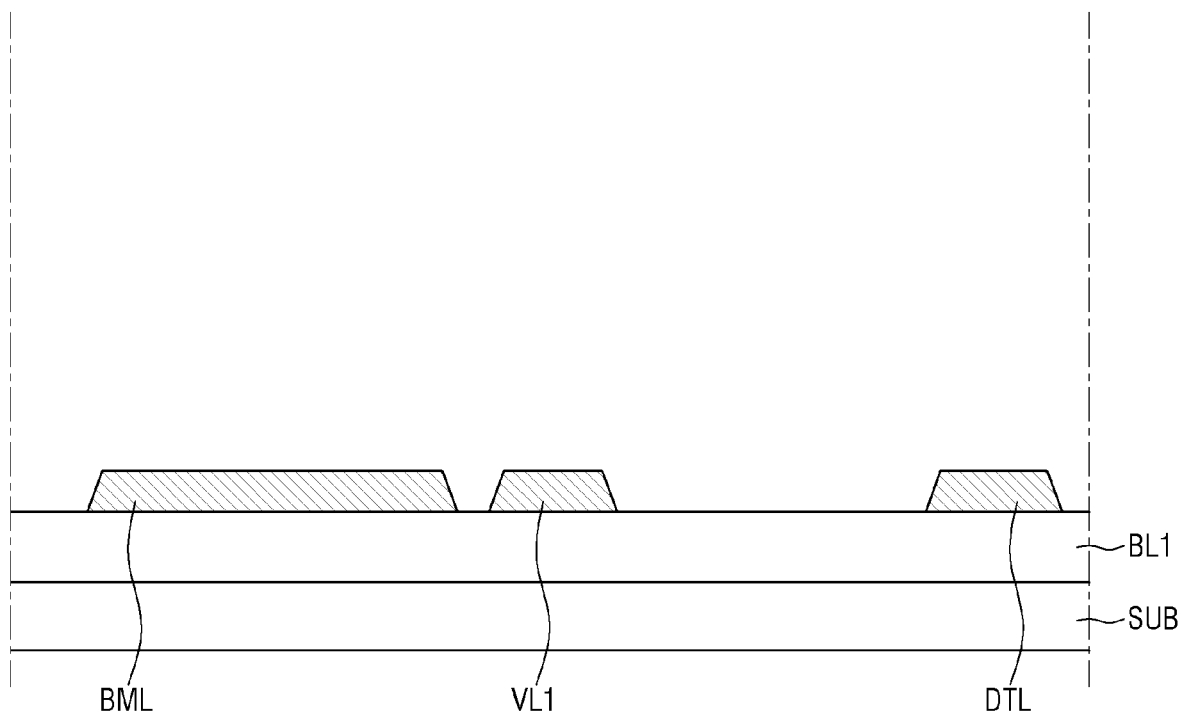
FIGS. 12 through 19 are schematic cross-sectional views illustrating a part of a process of fabricating a display device according to an embodiment.

Referring to FIG. 12, a first substrate SUB is prepared, and a first buffer layer BL1 and a first conductive layer are formed on the first substrate SUB (operation S10). The process of forming the first buffer layer BL1 may be performed through a process of depositing a material that forms the first buffer layer BL1 on the entire surface of the first substrate SUB. In an embodiment, the first buffer layer BL1 may be formed by a process such as, but not limited to, atomic layer deposition (ALD), chemical vapor deposition (CVD), physical vapor deposition (PVD), or sputtering.

The first conductive layer may include a bottom metal layer BML, a first voltage line VL1, a second voltage line VL2, and a data line DTL. Although the second voltage line VL2 is not illustrated in the drawing, the first conductive layer may also include the second voltage line VL2 as illustrated in other drawings. The process of forming the first conductive layer may be performed through a process of depositing a material that forms the first conductive layer on the entire surface of the first buffer layer BL1 and patterning the deposited material. In an embodiment, the patterning process may include depositing a first conductive layer material layer including the material that forms the first conductive layer, applying a photoresist layer on the first conductive layer material layer, forming a photoresist pattern through exposure and development, and etching the first conductive layer material layer using the photoresist pattern as an etch mask. However, the disclosure is not limited thereto.

Figure 13:
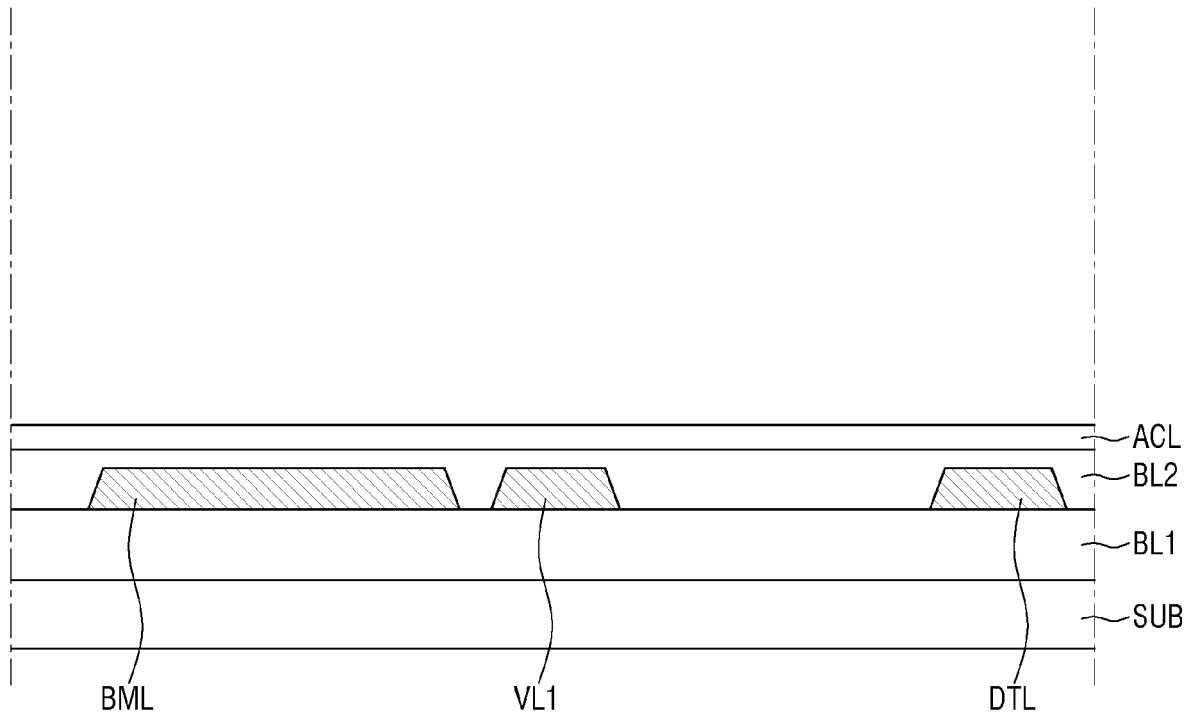
Figure 14:
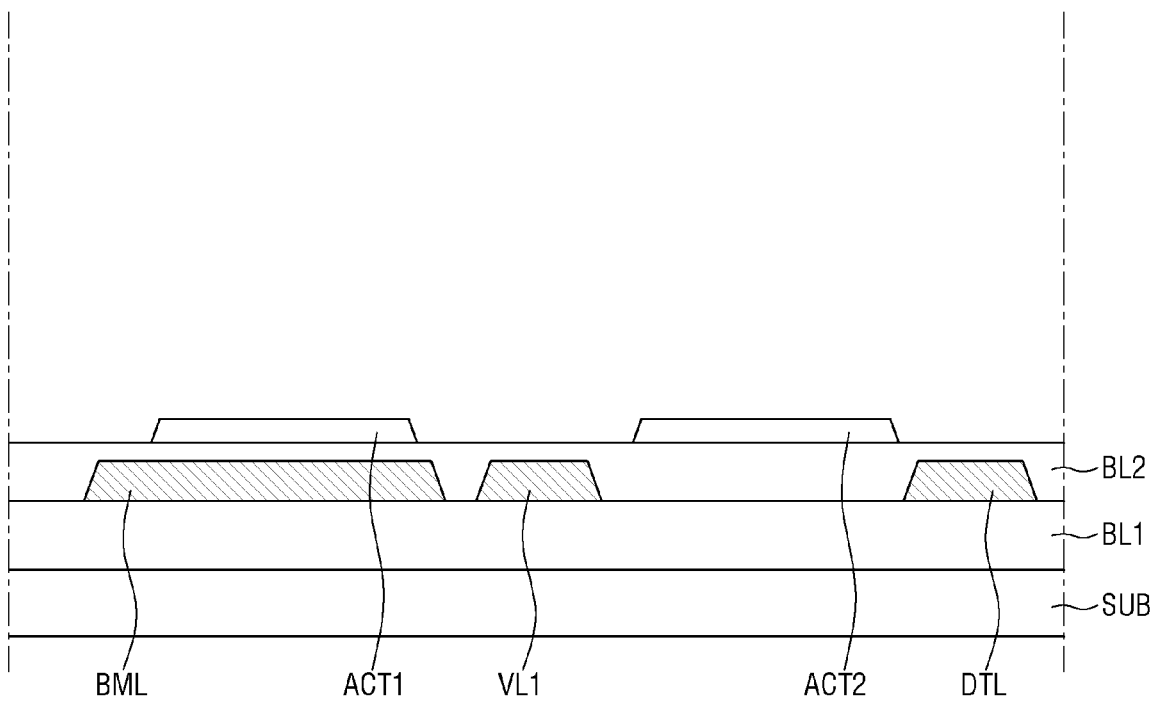

Referring to FIGS. 13 and 14, a second buffer layer BL2 and active layers ACT1 and ACT2 are formed on the first conductive layer (operation S20). The process of forming the second buffer layer BL2 may be performed through a process of depositing a material that forms the second buffer layer BL2 on the entire surface of the first substrate SUB and the first conductive layer. In an embodiment, the second buffer layer BL2 and the first buffer layer BL1 may be formed by a same process. However, the disclosure is not limited thereto.

The active layers ACT1 and ACT2 may include a first active layer ACT1 of a first transistor T1 and a second active layer ACT2 of a second transistor T2. The first active layer ACT1 may be formed to overlap the bottom metal layer BML of the first conductive layer. The process of forming the active layers ACT1 and ACT2 may be performed through a process of depositing an active layer material layer AU for forming the active layers ACT1 and ACT2 on the entire surface of the second buffer layer BL2 and patterning the active layer material layer ACL. For example, the patterning process may include depositing the active layer material layer ACL, applying a photoresist layer on the active layer material layer ACL, forming a photoresist pattern through exposure and development, and etching the active layer material layer using the photoresist pattern as an etch mask. However, the disclosure is not limited thereto. In an embodiment, the active layer material layer ACL may include an oxide semiconductor, and the active layers ACT1 and ACT2 may also be made of an oxide semiconductor.

Figure 15:
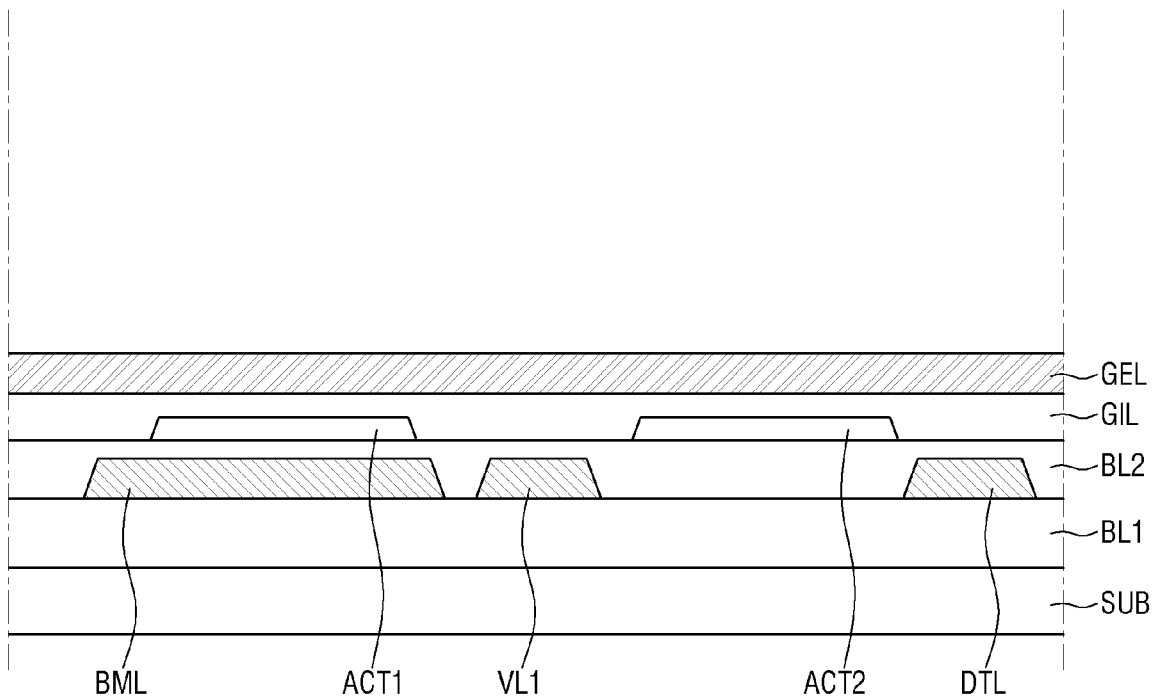
Figure 16:
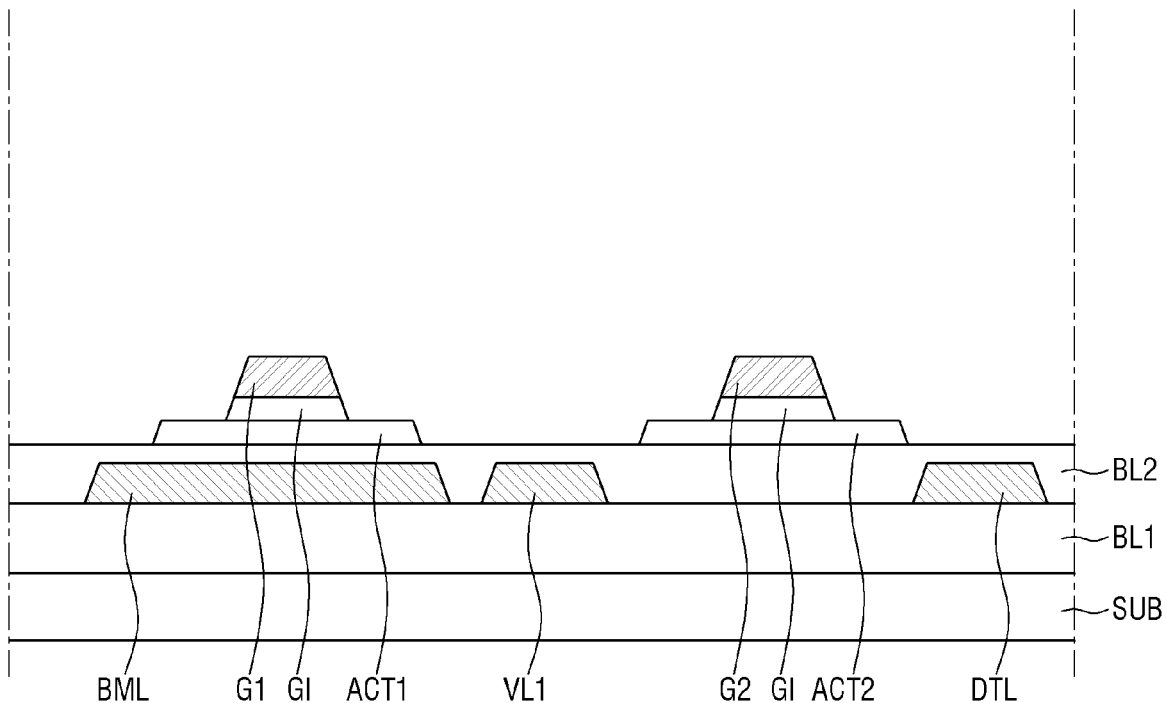

Referring to FIGS. 15 and 16, a first gate insulating layer GI and a second conductive layer are formed on the active layers ACT1 and ACT2 (operation S30). The second conductive layer may include a first gate electrode G1 of the first transistor T1 and a second gate electrode G2 of the second transistor T2. The first gate insulating layer GI may be patterned together with the second conductive layer and thus formed between the first active layer ACT1 and the first gate electrode G1 and between the second active layer ACT2 and the second gate electrode G2.

The process of forming the first gate insulating layer GI and the second conductive layer may be performed through a process of depositing a first gate insulating layer material layer GIL and a second conductive layer material layer GEL for forming the first gate insulating layer GI and the second conductive layer on the entire surface of the second buffer layer BL2 and the active layers ACT1 and ACT2, respectively, and patterning the first gate insulating layer material layer GIL and the second conductive layer material layer GEL. For example, the patterning process may include sequentially depositing the first gate insulating layer material layer GIL and the second conductive layer material layer GEL, applying a photoresist layer on the second conductive layer material layer GEL, forming a photoresist pattern through exposure and development, and simultaneously etching the first gate insulating layer material layer GIL and the second conductive layer material layer GEL by using the photoresist pattern as an etch mask. However, the disclosure is not limited thereto. In an embodiment in which the first gate insulating layer material layer GIL and the second conductive layer material layer GEL are simultaneously etched, the first gate insulating layer GI may be patterned together with the gate electrodes G1 and G2 of the second conductive layer, and their side surfaces may be aligned with each other.

Figure 17:
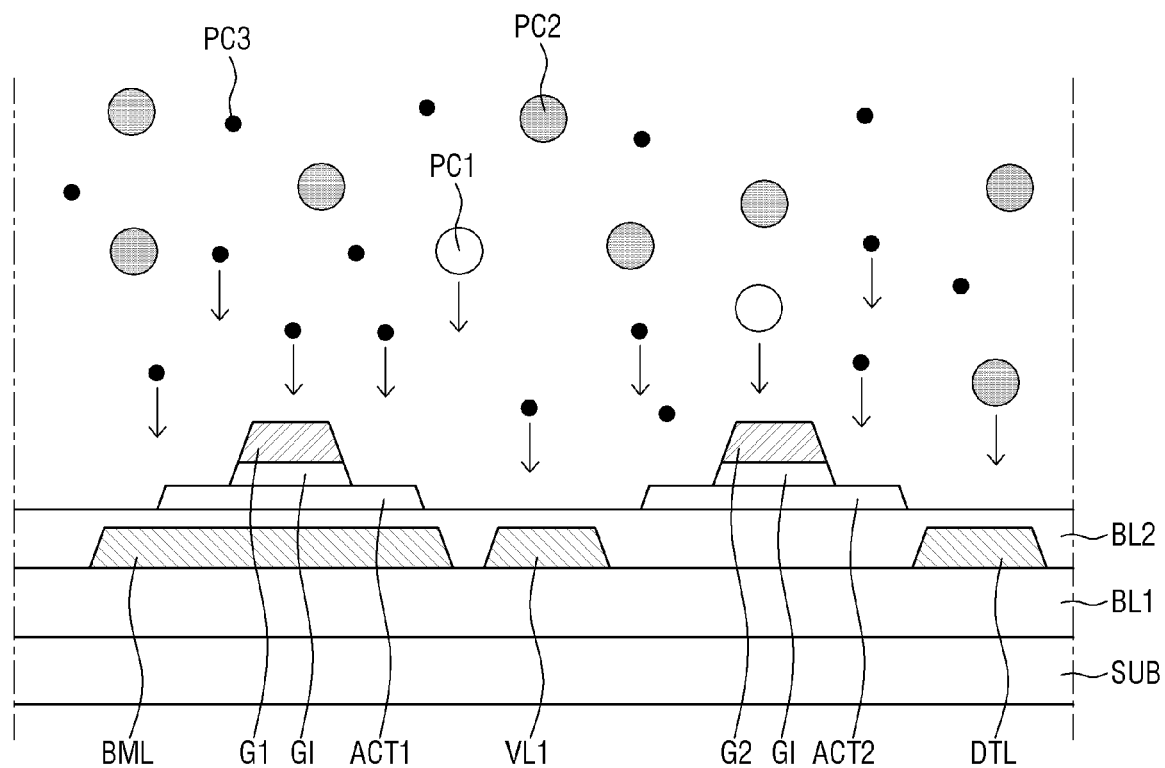
Figure 18:
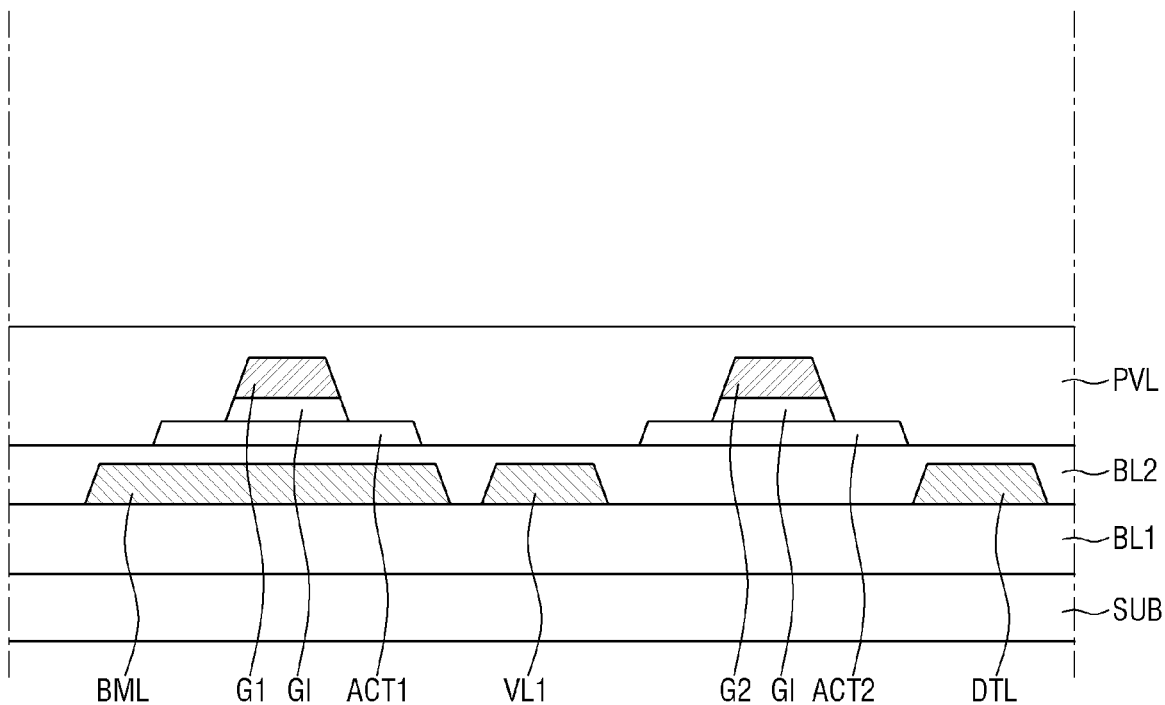
Figure 19:
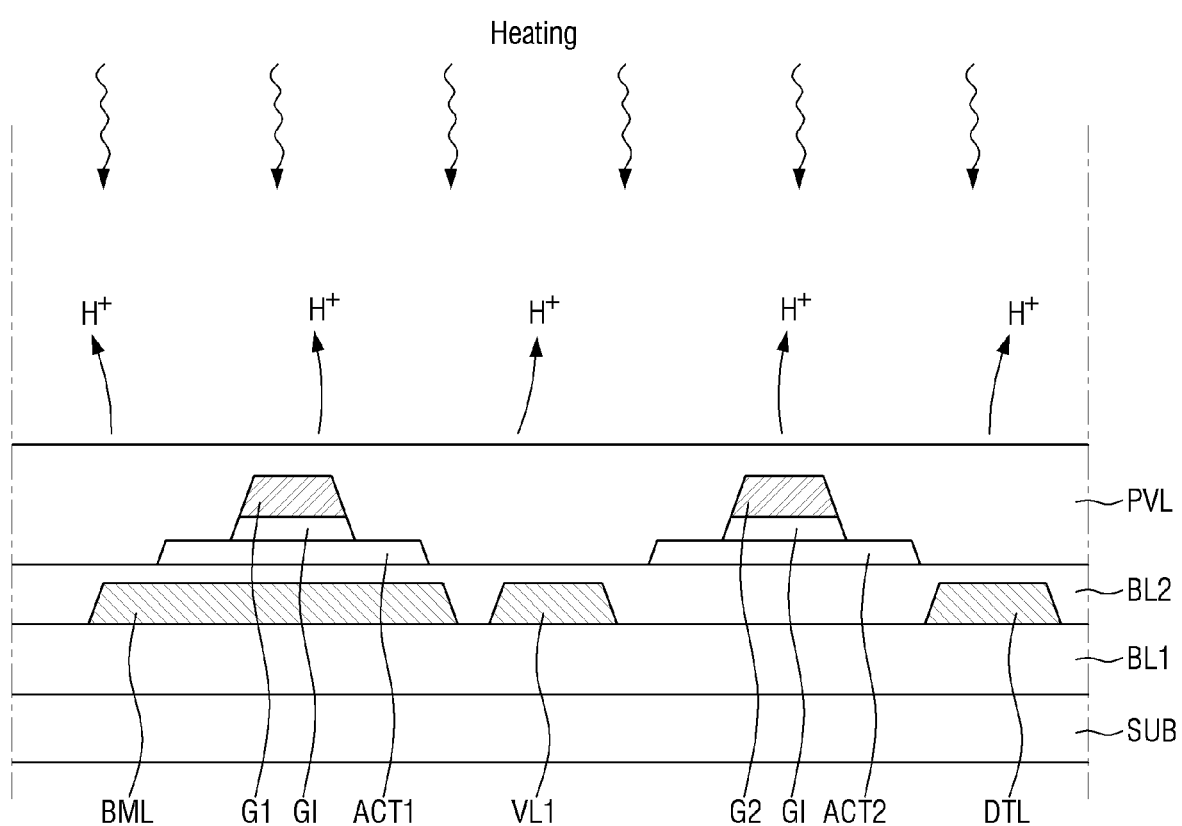

Referring to FIGS. 17 to 19, a passivation layer PVX is formed on the active layers ACT1 and ACT2 and the second conductive layer (operation S40). The process of forming the passivation layer PVX may include forming a passivation layer material layer PVL on the second buffer layer BL2, the active layers ACT1 and ACT2 and the second conductive layer and heat-treating the passivation layer material layer PVL. The passivation layer PVX of the display device 10 may include silicon nitride ($SiN_x$) having a low content of hydrogen. In the forming of the passivation layer material layer PVL, silicon nitride ($SiN_x$) having a relatively large number of silicon (Si)-hydrogen (H) bonds [Si—H] may be formed by adjusting an injection ratio of precursor materials PC1 to PC3 of the silicon nitride ($SiN_x$).

For example, as illustrated in FIGS. 17 and 18, the forming of the passivation layer material layer PVL may be performed through a process of depositing a silicon nitride ($SiN_x$) layer by injecting a first precursor material PC1, a second precursor material PC2, and a third precursor material PC3 into the second conductive layer at a ratio (e.g., a predetermined or selected ratio). In an embodiment in which the passivation layer PVX includes silicon nitride ($SiN_x$), the first precursor material PC1 may be $SiH_4$, the second precursor material PC2 may be $NH_3$, and the third precursor material PC3 may be $H_2$. In the process, the ratio of the number of nitrogen-hydrogen (H) bonds [N—H] to the number of silicon (Si)-hydrogen (H) bonds [Si—H] included in the passivation layer material layer PVL may be adjusted by adjusting contents of the second precursor material PC2 and the third precursor material PC3 compared with the content of the first precursor material PC1.

According to an embodiment, in the deposition process for forming the passivation layer material layer PVL, the ratio (PC1:PC2) of the first precursor material PC1 to the second precursor material PC2 injected may be in a range of about 1:4 to about 1:5, and the ratio (PC1:PC3) of the first precursor material PC1 to the third precursor material PC3 injected may be in a range of about 1:8 to about 1:10. For example, in the deposition process for forming the passivation layer material layer PVL, the ratio ($NH_3/SiH_4$) of an $NH_3$ gas to a $SiH_4$ gas injected may have a value of about 4 to about 5, and the ratio ($H_2/SiH_4$) of an $H_2$ gas to a $SiH_4$ gas injected may have a value of about 8 to about 10. In the silicon nitride ($SiN_x$) layer or the passivation layer material layer PVL thus formed, the ratio ([Si—H]:[N—H]) of the number of silicon (Si)-hydrogen (H) bonds [Si—H] to the number of nitrogen (N)-hydrogen (H) bonds [N—H] may be in a range of about 1:0.6 to about 1:1.5.

As illustrated in FIG. 19, in case that the passivation layer material layer PVL is formed, the passivation layer PVX may be formed by heat-treating the passivation layer material layer PVL. In case that the passivation layer material layer PVL is heat-treated, hydrogen contained in the passivation layer material layer PVL may be discharged. Since the passivation layer material layer PVL includes a large number of silicon (Si)-hydrogen (H) bonds [Si—H], it may discharge a larger amount of hydrogen compared with other silicon nitrides ($SiN_x$). In an embodiment, the process of heat-treating the passivation layer material layer PVL may be performed at a temperature of 250° C. or higher or about 280° C. Heat treatment performed in this temperature range may cause a sufficient amount of hydrogen to be discharged from the passivation layer material layer PVL. As a result, silicon nitride ($SiN_x$) having a low content of hydrogen may be formed.

Figure 20:
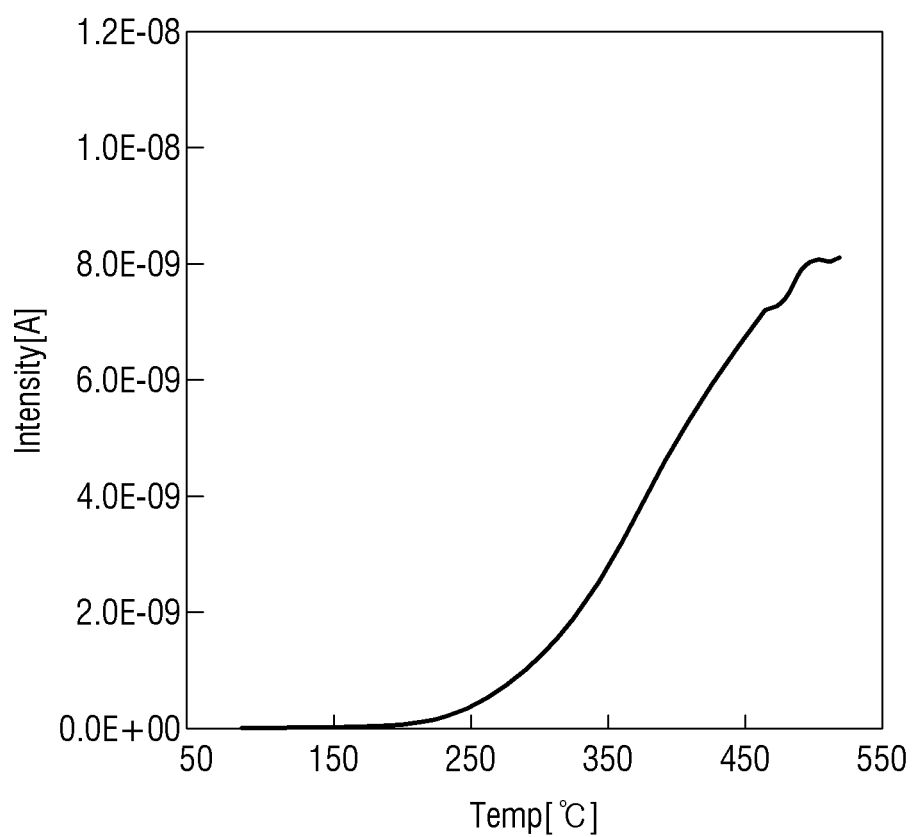
FIG. 20 is a graph illustrating the relative amount of hydrogen emitted in a heat treatment process of a passivation layer material layer.

FIG. 20 is a graph illustrating a relative amount of hydrogen discharged (or emitted) in a heat treatment process of a passivation layer material layer PVL. FIG. 20 illustrates the amount of hydrogen discharged from the passivation layer material layer PVL as a relative value according to the temperature of the heat treatment process.

Referring to FIG. 20, it can be seen that in case that the passivation layer material layer PVL made of silicon nitride ($SiN_x$) is heat-treated at a temperature of 250° C. or higher, the amount of hydrogen discharged increases. As the temperature of the heat treatment process increases, the relative amount of hydrogen discharged may increase (here, the unit [A] of the Y-axis represents the relative amount of hydrogen discharged). For example, in case that the ratio ([Si—H]: [N—H]) of the number of silicon (Si)-hydrogen (H) bonds [Si—H] to the number of nitrogen (N)-hydrogen (H) bonds [N—H] in the passivation layer material layer PVL is in a range of about 1:0.6 to about 1:1.5, the amount of hydrogen discharged by heat treatment performed at a temperature of about 280° C. may be $2.9 \times 10^{21}$ $mol/cm^3$ or more. A passivation layer PVX formed after the heat treatment process may include silicon nitride ($SiN_x$) having a low content of hydrogen.

Figure 21:
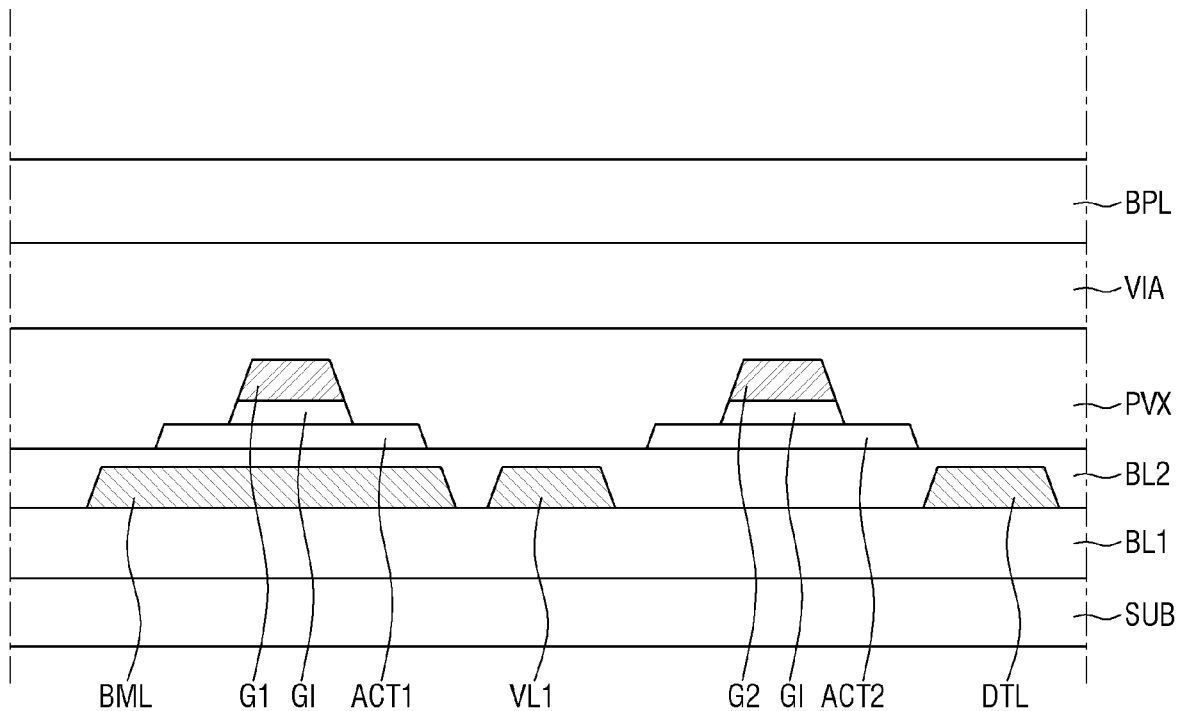
FIGS. 21 through 23 are schematic cross-sectional views illustrating a part of the process of fabricating the display device according to the embodiment.
Figure 22:
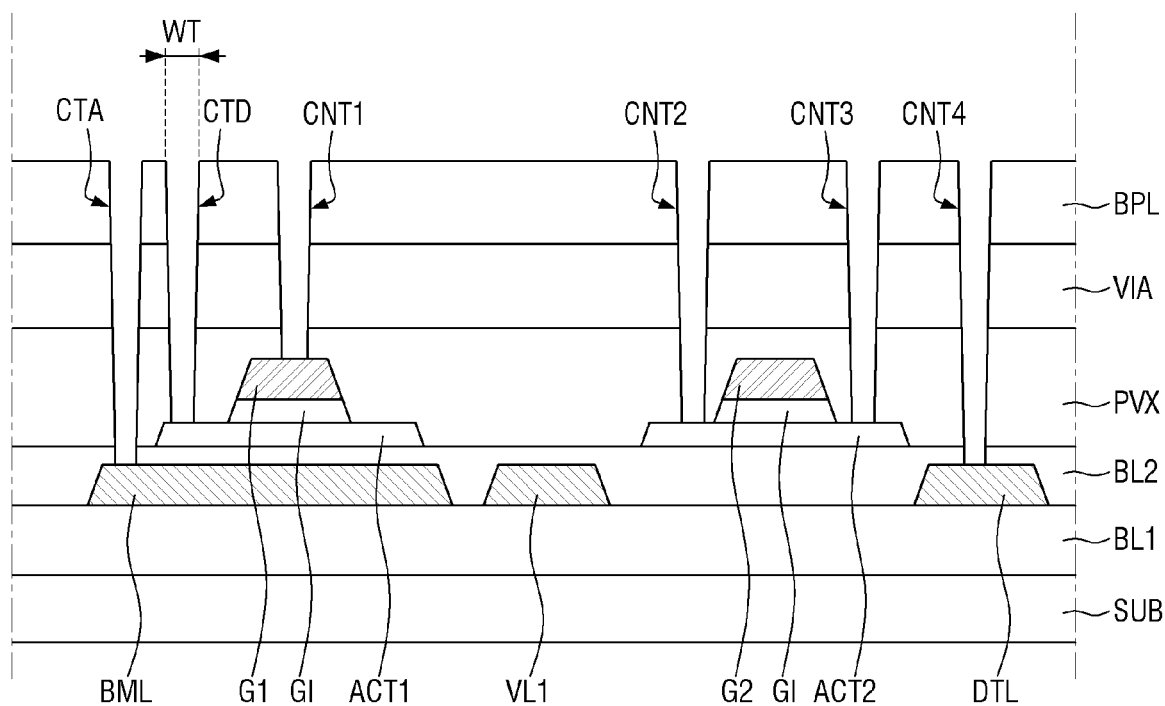
Figure 23:
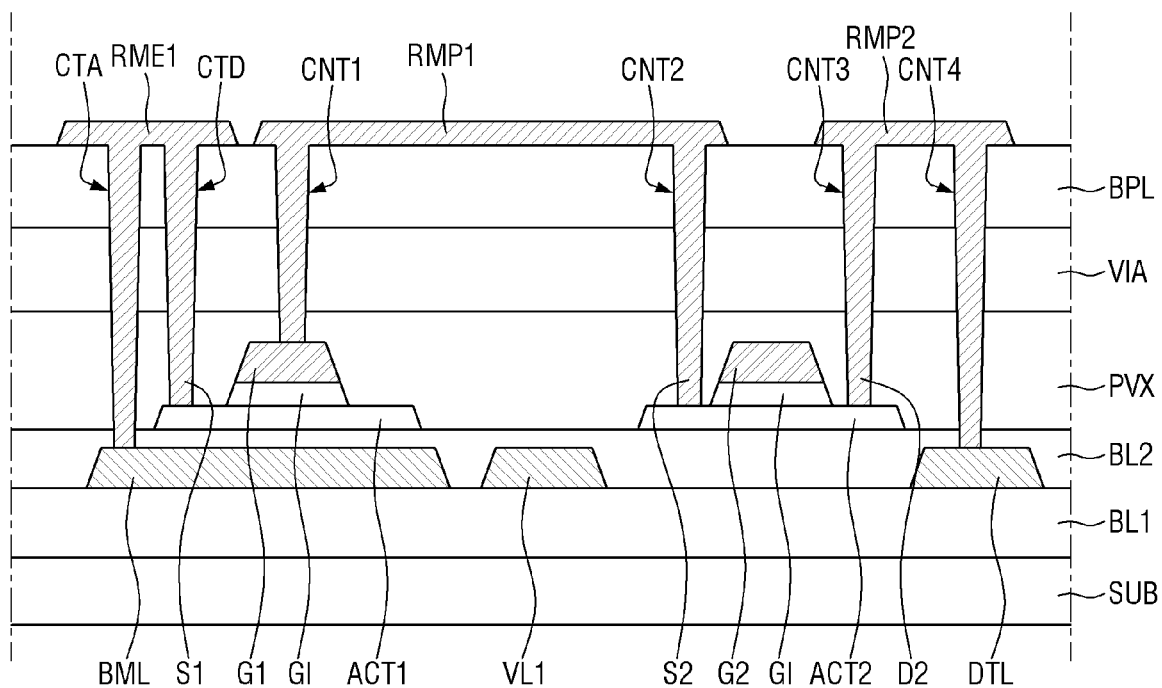

FIGS. 21 to 23 are schematic cross-sectional views illustrating a part of the process of fabricating the display device according to the embodiment.

Referring to FIG. 21, a via layer VIA and a bank pattern layer BPL are formed on the passivation layer PVX (operation S50). The process of forming the via layer VIA and the bank pattern layer BPL may be performed through a process of depositing materials that form the via layer VIA and the bank pattern layer BPL on the entire surface of the passivation layer PVX. The via layer VIA may be entirely deposited on the passivation layer PVX. On the other hand, although not illustrated in the drawing, the bank pattern layer BPL may be partially removed to form a trench part TP exposing the via layer VIA. The bank pattern layer BPL may include bank patterns BP1 and BP2 partially spaced apart from each other by the trench part TP.

Referring to FIGS. 22 and 23, contact holes penetrating the bank pattern layer BPL, the via layer VIA, the passivation layer PVX, and the second buffer layer BL2 are formed, and a third conductive layer is formed on the bank pattern layer BPL (operation S60). The process of forming the contact holes may be performed through a dry etching process. The contact holes may include a first electrode contact hole CTD, a first contact hole CNT1, a second contact hole CNT2, and a third contact hole CNT3 penetrating the bank pattern layer BPL, the via layer VIA, and the passivation layer PVX. In addition, the contact holes may include a third electrode contact hole CTA and a fourth contact hole CNT4 penetrating the bank pattern layer BPL, the via layer VIA, the passivation layer PVX, and the second buffer layer BL2. Although not illustrated in the drawings, the contact holes may include a second electrode contact hole CTS, a fifth contact hole CNT5, and a sixth contact hole CNT6. The second electrode contact hole CTS and the sixth contact hole CNT6 may penetrate the bank pattern layer BPL, the via layer VIA, the passivation layer PVX, and the second buffer layer BL2, and the fifth contact hole CNT5 may penetrate the bank pattern layer BPL, the via layer VIA, and the passivation layer PVX.

In the dry etching process for forming the contact holes, upper surfaces of the first conductive layer, the active layers ACT1 and ACT2, and the second conductive layer may be partially exposed. Oxygen vacancies may be formed in parts of the active layers ACT1 and ACT2 exposed in the etching process for forming the contact holes. The active layers ACT1 and ACT2 may directly contact the passivation layer PVX disposed thereon, and hydrogen may flow from the passivation layer PVX into the oxygen vacancies formed in the etching process. However, since the passivation layer PVX according to an embodiment includes silicon nitride ($SiN_x$) having a low content of hydrogen, the amount of hydrogen flowing into the active layers ACT1 and ACT2 may be small. Accordingly, even if hydrogen flows into the active layers ACT1 and ACT2, it may have a small effect on element characteristics of the transistors T1 and T2 including the active layers ACT1 and ACT2. In particular, since there is no change in the element characteristics of the transistors T1 and T2 in case that diameters WT of the contact holes are in a range of about 4 μm to about 10 μm, the diameters WT of the contact holes and the arrangement of pixels can be designed freely.

The third conductive layer including electrodes RME and electrode patterns RMP1 to RMP3 is formed on the bank pattern layer BPL. The electrodes RME may include a first electrode RME1 and a second electrode RME2, and the electrode patterns RMP1 to RMP3 may include a first electrode pattern RMP1, a second electrode pattern RMP2, and a third electrode pattern RMP3. The arrangement and structure of these elements are the same as those described above.

The process of forming the third conductive layer may be performed through a process of depositing a material that forms the third conductive layer on the entire surface of the bank pattern layer BPL and patterning the deposited material. In an embodiment, the patterning process may include depositing a third conductive layer material layer including the material that forms the third conductive layer, applying a photoresist layer on the third conductive layer material layer, forming a photoresist pattern through exposure and development, and etching the third conductive layer material layer using the photoresist pattern as an etch mask. However, the disclosure is not limited thereto.

Although not illustrated in the drawings, a first insulating layer PAS1, a bank layer BNL, light emitting elements ED, connection electrodes CNE1 and CNE2, a second insulating layer PAS2, and a third insulating layer PAS3 may be formed on the third conductive layer to fabricate the display device 10.

During the fabrication process of the display device 10 according to the embodiment, the passivation layer PVX including silicon nitride ($SiN_x$) having a low content of hydrogen may be formed through a content ratio of precursors injected and a heat treatment process. In the display device 10, the amount of hydrogen injected from the passivation layer PVX into the active layers ACT1 and ACT2 may be small. Thus, a change in element characteristics can be prevented. In addition, in the display device 10, the element characteristics of the transistors T1 and T2 may not change even if the diameters of the contact holes exposing the active layers ACT1 and ACT2 are changed within a range (e.g., a predetermined or selected range). Moreover, the pixels of the display device 10 can be designed freely.

In a method of fabricating a display device according to an embodiment, a passivation layer including silicon nitride having a low content of hydrogen can be formed.

In a display device according to an embodiment, the amount of hydrogen injected into active layers may be small. Thus, a change in element characteristics can be prevented. In addition, in the display device, the element characteristics of transistors may not change even if diameters of contact holes exposing the active layers are changed within a range. Moreover, pixels of the display device can be designed freely.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
a first conductive layer disposed on a substrate and comprising a first voltage line and a second voltage line;
a buffer layer disposed on the first conductive layer;
a semiconductor layer comprising a first active layer and a second active layer disposed on the buffer layer;
a first gate insulating layer disposed on the semiconductor layer;
a second conductive layer disposed on the first gate insulating layer and comprising:
a first gate electrode overlapping the first active layer in a plan view; and
a second gate electrode overlapping the second active layer in a plan view;
a passivation layer disposed on the second conductive layer and the semiconductor layer;
a via layer disposed on the passivation layer;
a bank pattern layer disposed on the via layer and comprising a first bank pattern and a second bank pattern partially spaced apart from each other;
a third conductive layer disposed on the bank pattern layer and comprising a first electrode and a second electrode spaced apart from each other; and
light emitting elements disposed on the first electrode and the second electrode of the third conductive layer, wherein
the passivation layer comprises silicon nitride ($SiN_x$), a ratio of a number of silicon-hydrogen bonds (Si—H) to a number of nitrogen-hydrogen bonds (N—H) in the silicon nitride (SiN$_x$) is in a range of about 1:0.6 to about 1:1.5, a first electrode contact hole that penetrates the bank pattern layer, the via layer, and the passivation layer; and a second electrode contact hole that penetrates the bank pattern layer, the via layer, the passivation layer, and the buffer layer.

2. The display device of claim 1, wherein a diameter of each of the first electrode contact hole and the second electrode contact hole measured on an upper surface of the bank pattern layer is in a range of about 4 to about 10 μm.

3. The display device of claim 1, wherein
the first electrode contact hole exposes a part of the first active layer,
the second electrode contact hole exposes a part of the second voltage line,
the first electrode directly contacts the first active layer through the first electrode contact hole, and
the second electrode directly contacts the second voltage line through the second electrode contact hole.

4. The display device of claim 1, wherein
the light emitting elements are disposed between the first bank pattern and the second bank pattern,
the first electrode is disposed on the first bank pattern, and
the second electrode is disposed on the second bank pattern.

5. The display device of claim 1, further comprising:
a first insulating layer that is disposed on the third conductive layer,
wherein the light emitting elements are disposed directly on the first insulating layer.

6. The display device of claim 5, comprising:
a second insulating layer disposed on the light emitting elements;
a third insulating layer disposed on the second insulating layer;
a first connection electrode disposed on the first electrode and electrically contacting first ends of the light emitting elements; and
a second connection electrode disposed on the second electrode and electrically contacting second ends of the light emitting elements.

7. The display device of claim 5, further comprising:
a bank layer that is disposed on the first insulating layer and surrounds an area where the light emitting elements are disposed.

8. A display device comprising
a first conductive layer disposed on a substrate and comprising a first voltage line and a second voltage line;
a buffer layer disposed on the first conductive layer;
a semiconductor layer comprising a first active layer and a second active layer disposed on the buffer layer;
a first gate insulating layer disposed on the semiconductor layer;
a second conductive layer disposed on the first gate insulating layer and comprising:
a first gate electrode overlapping the first active layer in a plan view; and
a second gate electrode overlapping the second active layer in a plan view;
a passivation layer disposed on the second conductive layer and the semiconductor layer;
a via layer disposed on the passivation layer;
a bank pattern layer disposed on the via layer and comprising a first bank pattern and a second bank pattern partially spaced apart from each other;
a third conductive layer disposed on the bank pattern layer and comprising a first electrode and a second electrode spaced apart from each other; and
light emitting elements disposed on the first electrode and the second electrode of the third conductive layer, wherein
the passivation layer comprises silicon nitride (SiN$_x$),
a ratio of a number of silicon-hydrogen bonds (Si—H) to a number of nitrogen-hydrogen bonds (N—H) in the silicon nitride (SiN$_x$) is in a range of about 1:0.6 to about 1:1.5, and
the passivation layer directly contacts the first active layer and the second active layer.

9. A display device comprising
a first conductive layer disposed on a substrate and comprising a first voltage line and a second voltage line;
a buffer layer disposed on the first conductive layer;
a semiconductor layer comprising a first active layer and a second active layer disposed on the buffer layer;
a first gate insulating layer disposed on the semiconductor layer;
a second conductive layer disposed on the first gate insulating layer and comprising:
a first gate electrode overlapping the first active layer in a plan view; and
a second gate electrode overlapping the second active layer in a plan view;
a passivation layer disposed on the second conductive layer and the semiconductor layer;
a via layer disposed on the passivation layer;
a bank pattern layer disposed on the via layer and comprising a first bank pattern and a second bank pattern partially spaced apart from each other;
a third conductive layer disposed on the bank pattern layer and comprising a first electrode and a second electrode spaced apart from each other; and
light emitting elements disposed on the first electrode and the second electrode of the third conductive layer, wherein
the passivation layer comprises silicon nitride (SiN$_x$),
a ratio of a number of silicon-hydrogen bonds (Si—H) to a number of nitrogen-hydrogen bonds (N—H) in the silicon nitride (SiN$_x$) is in a range of about 1:0.6 to about 1:1.5,
the first conductive layer further comprises:
a bottom metal layer overlapping the first active layer in a plan view; and
a data line electrically connected to the second active layer, and
the third conductive layer further comprises a plurality of electrode patterns electrically connected to any one of the first voltage line, the data line, and the first gate electrode.

10. The display device of claim 9, wherein the first electrode directly contacts the bottom metal layer through a third electrode contact hole penetrating the bank pattern layer, the via layer, the passivation layer, and the buffer layer.

11. The display device of claim 9, wherein
the electrode patterns comprise a first electrode pattern, and
the first electrode pattern directly contacts the first gate electrode through a first contact hole penetrating the bank pattern layer, the via layer, and the passivation layer and directly contacts the second active layer through a second contact hole penetrating the bank pattern layer, the via layer, and the passivation layer.

12. The display device of claim 9, wherein the electrode patterns comprise a second electrode pattern, and the second electrode pattern directly contacts the second active layer through a third contact hole penetrating the bank pattern layer, the via layer, and the passivation layer and directly contacts the data line through a fourth contact hole penetrating the bank pattern layer, the via layer, the passivation layer, and the buffer layer.

13. The display device of claim 9, wherein the electrode patterns comprise a third electrode pattern, and the third electrode pattern directly contacts the first active layer through a fifth contact hole penetrating the bank pattern layer, the via layer, and the passivation layer and directly contacts the first voltage line through a sixth contact hole penetrating the bank pattern layer, the via layer, the passivation layer, and the buffer layer.

* * * * *